(12) United States Patent
Son et al.

(10) Patent No.: US 11,088,284 B2
(45) Date of Patent: Aug. 10, 2021

(54) DISPLAY APPARATUS AND METHOD OF MANUFACTURING THE SAME

(71) Applicant: SAMSUNG DISPLAY CO., LTD., Yongin-si (KR)

(72) Inventors: Kyoungseok Son, Yongin-si (KR); Eoksu Kim, Yongin-si (KR); Jaybum Kim, Yongin-si (KR); Junhyung Lim, Yongin-si (KR); Jihun Lim, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 311 days.

(21) Appl. No.: 15/871,468

(22) Filed: Jan. 15, 2018

(65) Prior Publication Data

US 2018/0366586 A1 Dec. 20, 2018

(30) Foreign Application Priority Data

Jun. 16, 2017 (KR) .................. 10-2017-0076821

(51) Int. Cl.
*H01L 29/786* (2006.01)
*H01L 27/12* (2006.01)
*H01L 27/32* (2006.01)
*H01L 23/485* (2006.01)
(Continued)

(52) U.S. Cl.
CPC ........ *H01L 29/7869* (2013.01); *H01L 23/485* (2013.01); *H01L 27/1218* (2013.01); *H01L 27/1222* (2013.01); *H01L 27/1225* (2013.01); *H01L 27/1244* (2013.01); *H01L 27/1251* (2013.01); *H01L 27/1255* (2013.01); *H01L 27/1262* (2013.01); *H01L 27/3262* (2013.01); *H01L 27/3272* (2013.01); *H01L 27/3276* (2013.01); *H01L 51/0097* (2013.01);
(Continued)

(58) Field of Classification Search
None
See application file for complete search history.

(56) References Cited

U.S. PATENT DOCUMENTS

| 9,647,129 B2 | 5/2017 | Kurata et al. |
| 2012/0146886 A1* | 6/2012 | Minami .............. H01L 27/3276 345/80 |
| 2014/0055702 A1 | 2/2014 | Park et al. |

(Continued)

FOREIGN PATENT DOCUMENTS

| JP | 2016027652 A | 2/2016 |
| JP | 2016534390 A | 11/2016 |
| KR | 1020150101409 A | 9/2015 |

*Primary Examiner* — Abul Kalam
(74) *Attorney, Agent, or Firm* — Cantor Colburn LLP

(57) ABSTRACT

A display apparatus includes: a substrate on which a first area, a second area spaced apart from the first area, and a bending area between a first area and a second area and bent along a bending axis are defined; a first thin-film transistor ("TFT") and a second TFT; and a first conductive layer and a second conductive layer. The first TFT includes: a first active layer including polycrystalline silicon; a first gate electrode; and a first electrode disposed at a level which is the same as a level of the first conductive layer, and the second TFT includes: a second active layer including an oxide semiconductor; a second gate electrode; and a second electrode disposed at a level which is the same as a level of the second conductive layer.

11 Claims, 21 Drawing Sheets

(51) Int. Cl.
 *H01L 51/00* (2006.01)
 *H01L 27/06* (2006.01)
(52) U.S. Cl.
 CPC .... *H01L 27/0688* (2013.01); *H01L 2227/323* (2013.01); *H01L 2251/5338* (2013.01)

(56) References Cited

U.S. PATENT DOCUMENTS

| | | | |
|---|---|---|---|
| 2014/0097455 A1* | 4/2014 | Ono | H01L 27/124 257/91 |
| 2015/0053935 A1 | 2/2015 | Gupta et al. | |
| 2015/0055051 A1 | 2/2015 | Osawa et al. | |
| 2015/0123084 A1* | 5/2015 | Kim | H01L 27/1251 257/40 |
| 2016/0035805 A1* | 2/2016 | Kim | H01L 27/3276 345/76 |
| 2016/0064465 A1* | 3/2016 | Oh | H01L 27/1251 257/43 |
| 2016/0085125 A1* | 3/2016 | Park | H01L 27/124 349/43 |
| 2016/0372497 A1* | 12/2016 | Lee | G02F 1/136213 |
| 2017/0256569 A1* | 9/2017 | Ohara | H01L 27/1251 |
| 2017/0278901 A1* | 9/2017 | Kim | H01L 51/0097 |
| 2017/0309651 A1* | 10/2017 | Kim | G02F 1/13458 |
| 2019/0189722 A1* | 6/2019 | Lim | H01L 27/3272 |
| 2019/0288048 A1* | 9/2019 | Kang | H01L 27/3262 |
| 2019/0355799 A1* | 11/2019 | Jeong | H01L 51/0097 |

\* cited by examiner

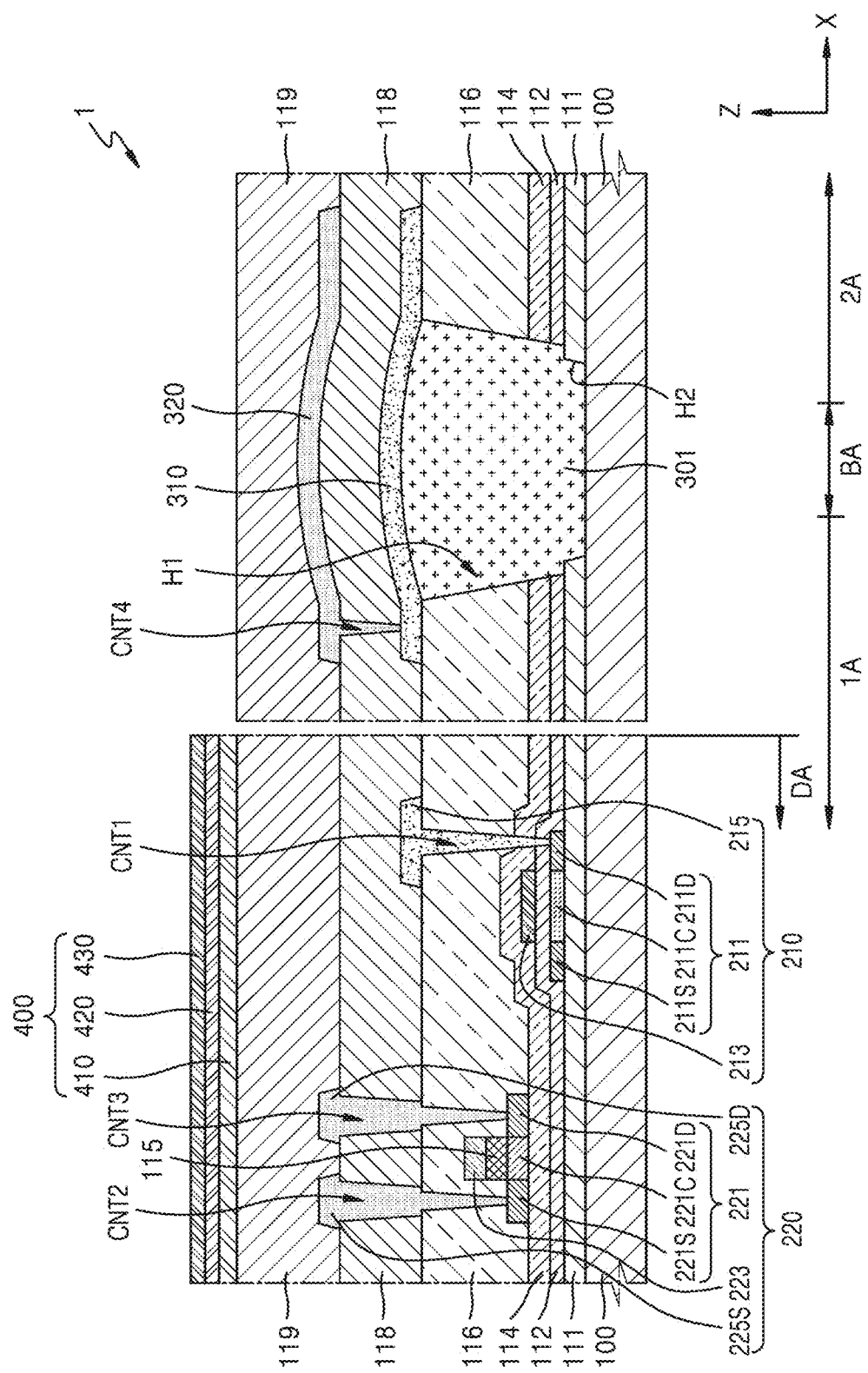

DISPLAY APPARATUS AND METHOD OF MANUFACTURING THE SAME

This application claims priority to Korean Patent Application No. 10-2017-0076821, filed on Jun. 16, 2017, and all the benefits accruing therefrom under 35 U.S.C. § 119, the content of which in its entirety is herein incorporated by reference.

BACKGROUND

1. Field

One or more embodiments relate to a display apparatus and a method of manufacturing the display apparatus, and more particularly, to a display apparatus driven by a thin film transistor ("TFT") including polycrystalline silicon and a TFT including an oxide semiconductor, and a method of manufacturing the display apparatus.

2. Description of the Related Art

A display apparatus typically includes a display device and a driving circuit for driving the display device. The driving circuit may include a thin-film transistor ("TFT") and a capacitor. Recently, a TFT including polycrystalline silicon has been widely used to realize a display apparatus having a high resolution.

In general, a display apparatus has a display area on a substrate. Recently, there have been studies done to improve visibility at various angles or reduce the size of a non-display area by bending at least a part of the display apparatus.

SUMMARY

In a thin-film transistor ("TFT") including polycrystalline silicon, a leakage current may occur, such that power consumption of a display apparatus including such a TFT may be increased.

In a display apparatus including a substrate including a bending area to improve visibility at various angles or reduce the size of a non-display area, a structure of the bending area may be complicated to prevent wiring disconnection due to tensile stress applied to the bending area, and thus manufacturing costs of the display apparatus may be increased.

One or more embodiments relate to a display apparatus having low power consumption and high resolution and a method of manufacturing the display apparatus.

One or more embodiments relate to a display apparatus in which contact resistance between an active layer including polycrystalline silicon and a conductive layer that contacts the active layer is substantially reduced or minimized.

One or more embodiments relate to a display apparatus with reduced manufacturing costs by minimizing the number of masks used during a manufacturing process thereof.

According to one or more embodiments, a display apparatus includes: a substrate on which first area, a second area spaced apart from the first area, and a bending area between a first area and a second area and bent along a bending axis; a first thin-film transistor ("TFT") disposed in the first area on the substrate; a second TFT disposed in the first area on the substrate; and a first conductive layer extending from the first area through the bending area to the second area; a second conductive layer extending from the first area through the bending area to the second area, where the first conductive layer and the second conductive layer are disposed at different levels from each other. In such an embodiment, the first TFT includes: a first active layer including polycrystalline silicon; a first gate electrode insulated from the first active layer; and a first electrode connected to the first active layer and disposed at a level which is the same as a level of the first conductive layer, and the second TFT includes: a second active layer including an oxide semiconductor; a second gate electrode insulated from the second active layer; and a second electrode connected to the second active layer and disposed at a level which is the same as a level of the second conductive layer.

In an embodiment, the display apparatus may further include a display device driven by the first TFT and the second TFT, where the first TFT is a driving TFT transmits driving current to the display device.

In an embodiment, the display apparatus may further include a first interlayer insulating layer disposed on the substrate to cover the first gate electrode, where the second active layer is disposed on the first interlayer insulating layer.

In an embodiment, the display apparatus may further include a second interlayer insulating layer disposed on the first interlayer insulating layer to cover the second gate electrode, where the first electrode is disposed on the second interlayer insulating layer.

In an embodiment, the display apparatus may further include a planarization layer disposed on the second interlayer insulating layer to cover the first electrode, where the second electrode is disposed on the planarization layer.

In an embodiment, the display apparatus may further include a connection electrode electrically connected to the first electrode and disposed at a level which is the same as a level of the second electrode.

In an embodiment, the first conductive layer and the second conductive layer may be electrically connected to each other and may be configured to transmit a driving signal to at least one of the first TFT and the second TFT.

In an embodiment, a plurality of through-holes may be defined in each of the first conductive layer and the second conductive layer.

In an embodiment, each of the first conductive layer, the second conductive layer, the first electrode and the second electrode may include aluminum (Al).

In an embodiment, the display apparatus may further include a bending organic layer disposed between the substrate and the first conductive layer, where at least a portion of the bending organic layer is disposed in the bending area.

In an embodiment, the display apparatus may further include a capacitor electrode disposed on the first gate electrode to face the first gate electrode, where the second active layer is disposed over the capacitor electrode.

According to one or more embodiments, a display apparatus includes: a substrate including a display area; a first TFT disposed in the display area on the substrate, and including a first active layer including polycrystalline silicon, a first gate electrode insulated from the first active layer, and a first electrode connected to the first active layer; a second TFT disposed in the display area on the substrate, and including a second active layer including an oxide semiconductor, a second gate electrode insulated from the second active layer, and a second electrode connected to the second active layer; a first interlayer insulating layer disposed between the first gate electrode and the second active layer; a second interlayer insulating layer disposed between the second gate electrode and the first electrode; and a planarization layer disposed between the first electrode and the second electrode.

In an embodiment, the substrate may further include a bending area, and the display apparatus may further include a first conductive layer disposed in the bending area at a level which is the same as a level of the first electrode and a second conductive layer disposed in the bending area at a level which is the same as a level of the second electrode.

According to one or more embodiments, a method of manufacturing a display apparatus including a substrate including a first area, a first TFT including a first active layer, a first gate electrode, and a first electrode, and a second TFT including a second active layer, a second gate electrode, and a second electrode, includes: providing the first active layer in the first area on the substrate, where the first active layer includes polycrystalline silicon; providing the first gate electrode on the first active layer to be insulated from the second active layer; providing a first interlayer insulating layer on the first gate electrode; providing the second active layer on the first interlayer insulating layer, where the second active layer includes an oxide semiconductor; providing the second gate electrode insulated from the second active layer, on the second active layer; providing a second interlayer insulating layer on the second gate electrode; forming a contact hole, through which a part of the first active layer is exposed, in the first interlayer insulating layer and the second interlayer insulating layer; providing a first electrode, which is filled in the contact hole and contacts the first active layer, on the second interlayer insulating layer; forming a first opening, through which a part of the second active layer is exposed, in the second interlayer insulating layer; providing a first planarization layer on the second interlayer insulating layer to cover the first electrode; forming a second opening in the first planarization layer to overlap the first opening; and providing a second electrode, which is filled in the first opening and the second opening and contacts the second active layer, on the first planarization layer.

In an embodiment, the substrate may further include a second area and a bending area between the first area and the second area, and the method may further include: providing a first conductive layer in the bending area; and providing a second conductive layer on the first conductive layer.

In an embodiment, the providing the first conductive layer and the providing the first electrode may be simultaneously performed with each other, and the providing the second conductive layer and the providing the second electrode may be simultaneously performed with each other.

In an embodiment, the first conductive layer and the second conductive layer may be electrically connected to each other.

In an embodiment, each of the first conductive layer, the second conductive layer, the first electrode and the second electrode may include aluminum (Al).

In an embodiment, the method may further include: providing a second planarization layer on the first planarization layer to cover the second electrode; and providing a display device, which is driven by the first TFT and the second TFT, on the second planarization layer.

In an embodiment, the first TFT may transmit a driving current to the display device.

In an embodiment, the method may further include providing a connection electrode electrically connected to the first electrode, where the providing the connection electrode and the providing the second electrode may be simultaneously performed with each other.

In an embodiment, the method may further include providing a capacitor electrode, which is insulated from the first gate electrode, on the first gate electrode between the providing the first gate electrode and the providing the second active layer.

In an embodiment, the method may further include: performing thermal treatment on the first active layer, after the forming the contact hole; and cleaning a surface of the first active layer, after the performing the thermal treatment.

BRIEF DESCRIPTION OF THE DRAWINGS

These and/or other features will become apparent and more readily appreciated from the following description of the embodiments, taken in conjunction with the accompanying drawings, in which:

FIG. 2 is a cross-sectional view illustrating a part of the display apparatus of FIG. 1;

DETAILED DESCRIPTION

Figure 1:
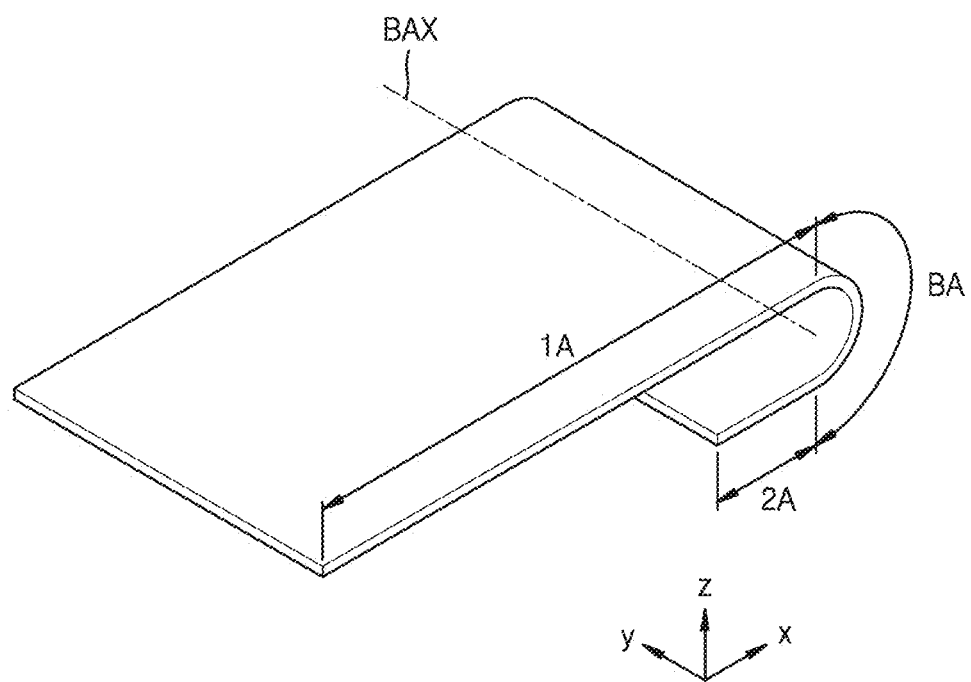
FIG. 1 is a perspective view of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Herein, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a perspective view of a display apparatus 1 according to an embodiment. FIG. 2 is a cross-sectional view illustrating a part of the display apparatus 1 of FIG. 1.

According to an embodiment, a part of a substrate 100 of the display apparatus 1 is bent, and thus a part of the display apparatus 1 is bent, as shown in FIG. 1. However, for convenience of illustration, FIG. 2 illustrates a state where the display apparatus 1 is not bent. For reference, for convenience of illustration, cross-sectional views of embodiments in a state where the display apparatus 1 is not bent are shown.

Referring to FIGS. 1 and 2, an embodiment of the display apparatus 1 includes the substrate 100, on which a first area 1A, a second area 2A, and a bending area BA between a first area 1A and a second area 2A and bent along a bending axis BAX are defined, a first thin-film transistor ("TFT") 210 and a second TFT 220, which are located in the first area 1A on the substrate 100, and further includes a first conductive layer 310 and a second conductive layer 320 which extend from the first area 1A through the bending area BA to the second area 2A and are located at different levels from each other. Herein, a level of an element of the display apparatus is defined as a height of an upper surface thereof (or a lower surface of an upper flat portion) with respect to an upper surface of the substrate 100.

The substrate 100 may be a flexible substrate that may be effectively bent, and includes the bending area BA that extends in a first direction (e.g., a +y direction). The bending area BA is defined between the first area 1A and the second area 2A in a second direction (e.g., a +x direction) that intersects the first direction. The substrate 100 is bent along the bending axis BAX that extends in the first direction (e.g., the +y direction) as shown in FIG. 1. The substrate 100 that is flexible may include at least one of various materials, for example, a polymer resin such as polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate ("PC"), or cellulose acetate propionate ("CAP"). According to an embodiment, the substrate 100 may include PI having high bendability and may have a thickness in a range from several to tens of micrometers (μm).

In an embodiment, the first area 1A includes a display area DA. The first area 1A may include a part of a non-display area outside the display area DA in addition to the display area DA as shown in FIG. 2. Alternatively, the display area DA may extend to the bending area BA. The second area 2A may also include the non-display area. In an embodiment, the display area DA may extend further to the second area 2A, or the second area 2A may include a separate display area.

In an embodiment, as shown in FIG. 2, a display device (or a display element) 400 and a driving circuit for driving the display device 400 may be disposed in the display area DA of the substrate 100. The driving circuit may include the first TFT 210 and the second TFT 220. The second TFT 220 may be a switching TFT that is connected to a scan line and a data line and receives a turn-on signal from the scan line and transmit a data signal to the first TFT 210. The first TFT 210 may be a driving TFT that outputs current corresponding to a transmitted data voltage to the display device 400. In an alternative embodiment, the second TFT 220 may be a TFT that performs various functions such as compensation and initialization in the driving circuit.

In an embodiment, as shown in FIG. 2, the display device 400 may be an organic light-emitting device in the display area DA, and the display device 400 may include a pixel electrode 410, an intermediate layer 420 disposed on the pixel electrode 410 and including an organic emission layer, and a counter electrode 430.

The first TFT 210 may be directly connected through a via-hole VIA (see FIG. 3A) to the pixel electrode 410 of the organic light-emitting device or may be indirectly connected through another TFT such as an emission TFT to the pixel electrode 410.

In an embodiment, a TFT (not shown) may be disposed in the non-display area outside the display area DA of the substrate 100. The TFT in the non-display area may be, for example, a part of a circuit unit for controlling an electrical signal applied to the display area DA.

The first TFT 210 may include a first active layer 211 including polycrystalline silicon, a first gate electrode 213 insulated from the first active layer 211, and a first electrode 215 connected to the first active layer 211. In an embodiment, the first TFT 210 may function as a driving TFT.

The second TFT 220 may include a second active layer 221 including an oxide semiconductor, a second gate electrode 223 insulated from the second active layer 221, and a second electrode 225 including a source electrode 225S and a drain electrode 225D and connected to the second active layer 221. In an embodiment, the second TFT 220 may function as a switching TFT. Alternatively, the second TFT 220 may be any TFT other than a driving TFT included in the driving circuit.

According to an embodiment, the first active layer 211 of the first TFT 210 that functions as a driving TFT may include or be formed of polycrystalline silicon having high reliability, and the second active layer 221 of the second TFT 220 that functions as a switching TFT may include or be formed of an oxide semiconductor having low leakage current.

In such an embodiment, since a driving TFT that directly affects a brightness of the display device 400 includes an active layer including or formed of polycrystalline silicon having high reliability, the display apparatus 1 may have a high resolution.

In such an embodiment, since an oxide semiconductor has high carrier mobility and low leakage current, an undesired or drastic voltage drop may not occur even when a driving time is long. In such an embodiment, since an undesired or drastic color change of an image due to a voltage drop may not occur even during low frequency driving, low frequency driving may be effectively performed. In such an embodiment, power consumption when the driving circuit includes a TFT including an active layer including or formed of an oxide semiconductor may be less than that when each of all TFTs included in the driving circuit includes an active layer including or formed of polycrystalline silicon. Accordingly, when at least one of TFTs other than a driving TFT includes an active layer including or formed of an oxide semiconductor, power consumption of the display apparatus 1 may be reduced.

Elements included in the display apparatus 1 will now be described in greater detail with reference to FIG. 2.

The first active layer 211 including polycrystalline silicon may be disposed on the substrate 100, and a buffer layer 111 may be disposed between the substrate 100 and the first active layer 211. The buffer layer 111 may have a single layer structure or a multi-layer structure, and may planarize a top surface of the substrate 100 and prevent or reduce penetration of impurities from the substrate 100 into the first active layer 211.

The first active layer 211 may be disposed on the buffer layer 111, and may include a first source region 211S and a first drain region 211D that are doped with impurities, are conductive and are spaced apart from each other, and a first channel region 211C located between the first source region 211S and the first drain region 211D. The first source region 211S and the first drain region 211D may correspond to a source electrode and a drain electrode of the first TFT 210, respectively.

The first gate electrode 213 may be disposed on the first active layer 211, and a first gate insulating layer 112 including an inorganic material such as silicon oxide, silicon nitride and/or silicon oxynitride, may be located between the first active layer 211 and the first gate electrode 213. In one embodiment, for example, the first gate electrode 213 may have a single-layer structure including molybdenum (Mo).

A first interlayer insulating layer 114, including an inorganic material such as silicon oxide, silicon nitride and/or silicon oxynitride, may be disposed on the first gate electrode 213.

The second active layer 221 including an oxide semiconductor may be disposed on the first interlayer insulating layer 114, and may include a second source region 221S and a second drain region 221D that are conductive and are spaced apart from each other and a second channel region 221C located between the second source region 221S and the second drain region 221D. In one embodiment, for example, the oxide semiconductor may include indium-gallium-zinc oxide (InGaZnO). In such an embodiment, the second TFT 220 may be disposed over the first gate electrode 213.

The second gate electrode 223 may be disposed on the second active layer 221, and a second gate insulating layer 115 for insulating the second active layer 221 and the second gate electrode 223 may be disposed between the second active layer 221 and the second gate electrode 223. The second gate insulating layer 115 and the second gate electrode 223 may be formed through a same mask process, and thus the second gate insulating layer 115 and the second gate electrode 223 may have a substantially same area (or same planar shape) as each other. In one embodiment, for example, the second gate electrode 223 may have a single-layer structure including molybdenum (Mo).

A second interlayer insulating layer 116 may be disposed on the second gate electrode 223, and the first electrode 215 connected to the first drain region 211D of the first active layer 211 may be disposed on the second interlayer insulating layer 116. Each of the second gate insulating layer 115 and the second interlayer insulating layer 116 may include an inorganic material such as silicon oxide, silicon nitride and/or silicon oxynitride, and the first electrode 215 may directly contact the first drain region 211D of the first active layer 211 through a first contact hole CNT1 including openings defined in the first gate insulating layer 112, the first interlayer insulating layer 114 and the second interlayer insulating layer 116, respectively.

The first drain region 211D of the first active layer 211 and the first electrode 215 may directly contact each other. In such an embodiment, if contact resistance between the first drain region 211D and the first electrode 215 is large, driving current may be reduced and an intensity of light emitted from the display device 400 may be reduced. Accordingly, it is desired to minimize the contact resistance between the first drain region 211D and the first electrode 215.

A first planarization layer 118 may be disposed on the first electrode 215, and the second electrode 225 connected to the second active layer 221 of the second TFT 220 may be disposed on the first planarization layer 118. In an embodiment, as shown in FIG. 2, the second electrode 225 include the source electrode 225S and the drain electrode 225D respectively connected to the second source region 221S and the second drain region 221D of the second active layer 221, but not being limited thereto. Alternatively, the second electrode 225 may include only one of the source electrode 225S and the drain electrode 225D.

The first planarization layer 118 may include an organic material, and may be located between the first electrode 215 of the first TFT 210 and the second electrode 225 of the second TFT 220. The source electrode 225S may be connected to the second source region 221S of the second active layer 221 through a second contact hole CNT2 including openings defined in the second interlayer insulating layer 116 and the first planarization layer 118, respectively, and the drain electrode 225D may be connected to the second drain region 221D of the second active layer 221 through a third contact hole CNT3 including openings defined in the second interlayer insulating layer 116 and the first planarization layer 118, respectively.

Each of the buffer layer 111, the first gate insulating layer 112, the first interlayer insulating layer 114 and the second interlayer insulating layer 116 may include or be formed of an inorganic material, such that a crack may occur therein during bending. Accordingly, in such an embodiment, the buffer layer 111, the first gate insulating layer 112, the first interlayer insulating layer 114 and the second interlayer insulating layer 116 may not be provided in the bending area BA on the substrate 110. Referring to FIG. 2, openings are defined in the first gate insulating layer 112, the first interlayer insulating layer 114 and the second interlayer insulating layer 116, respectively, and the openings may define a first opening H1. In such an embodiment, a second opening H2 that overlaps at least a part of the first opening H1 may be defined through the buffer layer 111. The first opening H1 and the second opening H2 may be defined at positions corresponding to (e.g., over) the bending area BA, a portion of the first area 1A adjacent to the bending area BA, and a portion of the second area 2A adjacent to the bending area BA, and a bending organic layer 301 may be disposed or provided in the first opening H1 and the second opening H2.

In such an embodiment, since the bending organic layer 301 includes an organic material, the possibility of crack occurrence is low. Accordingly, the possibility of crack occurrence in portions of the first conductive layer 310 and the second conductive layer 320 located on the bending organic layer 301 and in the bending area BA may be effectively prevented or substantially minimized. In such an embodiment, since the bending organic layer 301 has a stiffness that is less than that of a layer including or formed of an inorganic material, the bending organic layer 301 may absorb tensile stress generated when the substrate 100 or the like is bent, and thus concentration of tensile stress on the first conductive layer 310 and the second conductive layer 320 may be effectively minimized.

The first conductive layer 310 may be disposed on the bending organic layer 301. The first conductive layer 310 may extend from the first area 1A through the bending area BA to the second area 2A. In one embodiment, for example, the first conductive layer 310 may be electrically connected to an integrated circuit ("IC") chip (not shown) disposed in the second area 2A and may transmit a signal for driving the display apparatus 1 from the IC chip to the driving circuit located in the display area DA.

The first planarization layer 118 may be disposed on the first conductive layer 310, and the second conductive layer 320 may be disposed on the first planarization layer 118. The second conductive layer 320 may be connected to the first conductive layer 310 through a fourth contact hole CNT4 defined in the first planarization layer 118. Each of the first conductive later 310 and the second conductive layer 320 may include aluminum (Al), and may have a three-layer structure in which, for example, titanium, aluminum and titanium (Ti/Al/Ti) are sequentially stacked on one another.

The display apparatus 1 includes the bending area BA, and the first conductive layer 310 is desired to be in the bending area BA to connect the first area 1A and the second area 2A. Although the bending area BA includes aluminum (Al) having a high elongation, disconnection may occur during bending. According to an embodiment, the display apparatus 1 may further include the second conductive layer 320 that is at a level or in a layer that is different from that of the first conductive layer 310 and is electrically connected to the first conductive layer 310, to effectively transmit a signal even when disconnection occurs in a part of the first conductive layer 310.

In an embodiment, the first conductive layer 310 may be at a level that is the same as that of the first electrode 215 of the first TFT 210, and may include a material that is the same as that of the first electrode 215. In such an embodiment, the first electrode 215 may be disposed on the second interlayer insulating layer 116, and at least a part of the first conductive layer 310 may also be disposed on the second interlayer insulating layer 116. In such an embodiment, the first electrode 215 and the first conductive layer 310 may be provided or formed through a same mask process, which will be described later in greater detail.

In an embodiment, the second conductive layer 320 may be disposed at a level (or in a layer) that is the same as that of the second electrode 225 of the second TFT 220, and may include a material that is the same as that of the second electrode 225. In such an embodiment, the second electrode 225 including the source electrode 225S and the drain electrode 225D may be disposed on the first planarization layer 118, and at least a part of the second conductive layer 320 may also be disposed on the first planarization layer 118. In such an embodiment, the second electrode 225 and the second conductive layer 320 may be provided or formed through a same mask process, which will be described later in greater detail.

A second planarization layer 119 may be disposed on the second electrode 225 and the second conductive layer 320, and the display device 400 may be disposed on the second planarization layer 119. The second planarization layer 119 may include or be formed of an organic material such as acryl, polyimide, benzocyclobutene ("BCB") or hexamethyldisiloxane ("HMDSO"), and the display device 400 may be disposed on a surface planarized by the second planarization layer 119. In an embodiment, as shown in FIG. 2, the second planarization layer 119 is disposed in the first area 1A, the bending area BA and the second area 2A, but not being limited thereto. Alternatively, the second planarization layer 119 may be disposed only in the first area 1A.

Although not shown, in an embodiment, a bending protection layer ("BPL", not shown) may be disposed on the second conductive layer 320 in the bending area BA. In such an embodiment, when a stacked body is bent, a stress neutral plane exists in the stacked body. If the BPL does not exist, excessive tensile stress or the like may be applied to the first and second conductive layers 310 and 320 in the bending area BA when the substrate 100 or the like is bent because positions of the first and second conductive layers 310 and 320 may not correspond to that of a stress neutral plane. In an embodiment, where the BPL is provided, a position of a stress neutral plane in a stacked body including the substrate 100, the first and second conductive layers 310 and 320, and the BPL may be adjusted by adjusting a thickness and a modulus of the BPL. Accordingly, in such an embodiment, tensile stress applied to the first and second conductive layers 310 and 320 may be minimized by locating a stress neutral plane near the first and second conductive layers 310 and 320 by using the BPL.

In one embodiment, for example, the display device 400 may be an organic light-emitting device, and may include the pixel electrode 410, the intermediate layer 420 disposed on the pixel electrode 410 and including an organic emission layer, and the counter electrode 430 disposed on the intermediate layer 420.

The pixel electrode 410 may be directly connected to the first TFT 210, or may be indirectly connected to the first TFT 210 through another TFT (not shown) for controlling light emission.

The pixel electrode 410 may be a reflective electrode including a reflective layer. In one embodiment, for example, the reflective layer may include or be formed of at least one selected from silver (Ag), magnesium (Mg), aluminum (Al), platinum (Pt), palladium (Pd), gold (Au), nickel (Ni), neodymium (Nd), iridium (Ir) and chromium (Cr), and a transparent or semi-transparent electrode layer including or formed of at least one selected from indium tin oxide ("ITO"), indium zinc oxide ("IZO"), zinc oxide (ZnO), indium oxide ($In_2O_3$), indium gallium oxide ("IGO") and aluminum zinc oxide ("AZO") may be further disposed on the reflective layer.

According to an embodiment, the pixel electrode 410 may have a three-layer structure of ITO/Ag/ITO.

The intermediate layer 420 of the organic light-emitting device may include an organic emission layer, and may further include at least one of a hole injection layer ("HIL"), a hole transport layer ("HTL"), an electron transport layer ("ETL") and an electron injection layer ("EIL"), but not being limited thereto. Alternatively, the intermediate layer 420 may further include any of various other functional layers.

In such an embodiment, the structure of the intermediate layer 420 may be variously modified. In an embodiment, the intermediate layer 420 may include a layer that is integrated over a plurality of the pixel electrodes 410, or may include a layer that is patterned to correspond to each of the plurality of pixel electrodes 410.

The organic emission layer may have a multi-layer structure in which a red light-emitting layer, a green light-emitting layer and a blue light-emitting layer are stacked on one another to emit white light, or may have a single-layer structure including a red light-emitting material, a green light-emitting material and a blue light-emitting material. The organic light-emitting device including the organic emission layer may additionally include a red color filter, a green color filter and a blue color filter to emit full color light.

The counter electrode 430 may be a transparent (or semi-transparent) electrode. In one embodiment, for example, the counter electrode 430 may include one or more materials selected from among silver (Ag), aluminum (Al), magnesium (Mg), lithium (Li), calcium (Ca), copper (Cu), LiF/Ca, LiF/Al, MgAg, and CaAg, and may be a thin film having a thickness in a range from several to tens of nm to transmit light.

Although not shown, an encapsulation layer (not shown) that covers the display device 400 may be disposed on the display device 400, and may protect the display device 400 from external moisture or oxygen.

Figure 3A:
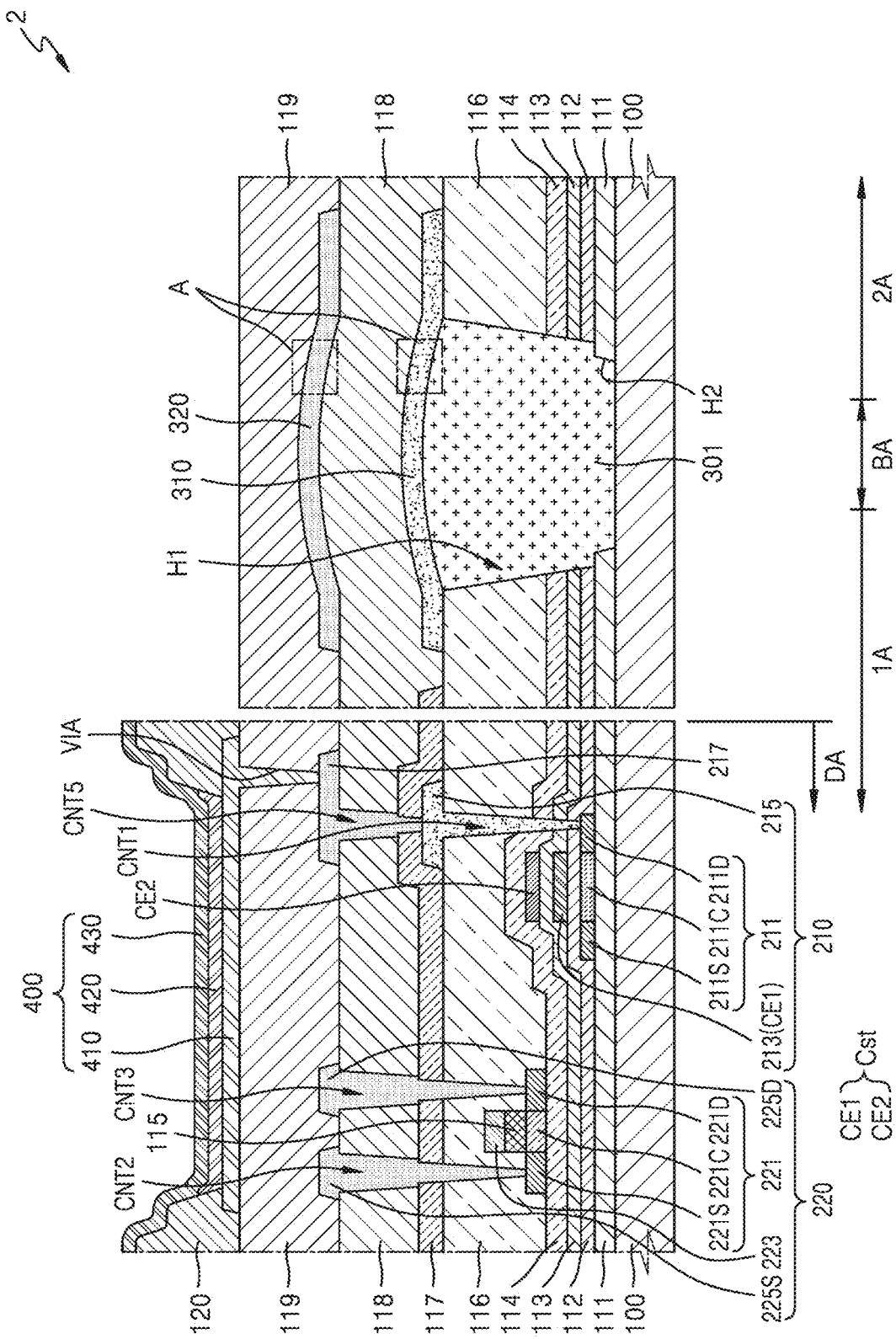
FIG. 3A is a cross-sectional view of a display apparatus according to an alternative embodiment.
Figure 3B:
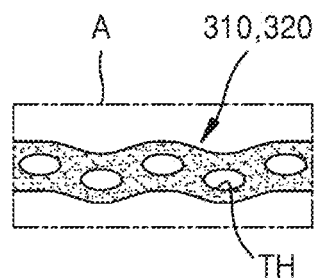
FIG. 3B is an enlarged view of the encircled portion A of FIG. 3A.

FIG. 3A is a cross-sectional view of a display apparatus 2 according to an alternative embodiment, and FIG. 3B is an enlarged view of the encircled portion A in FIG. 3A. The same or like elements shown in FIG. 3A have been labeled with the same reference characters as used above to describe the embodiments of the display apparatus in FIG. 2, and any repetitive detailed description thereof will hereinafter be omitted or simplified.

In an embodiment, as shown in FIG. 3A, the display apparatus 2 includes the substrate 100 including the bending area BA between the first area 1A and the second area 2A and bent along the bending axis BAX (see FIG. 1), the first TFT 210 and the second TFT 220 disposed in the first area 1A on the substrate 100, and the first conductive layer 310 and the second conductive layer 320 extending from the first area 1A through the bending area BA to the second area 2A and disposed at different levels (or in different layers) from each other. In such an embodiment, the first TFT 210 includes the first active layer 211 including polycrystalline silicon, the first gate electrode 213 insulated from the first active layer 211, and the first electrode 215 connected to the first active layer 211 and located at a level that is the same as that of the first conductive layer 310, and the second TFT 220 includes the second active layer 221 including an oxide semiconductor, the second gate electrode 223 insulated from the second active layer 221, and the second electrode 225 including the source electrode 225S and the drain electrode 225D, connected to the second active layer 221, and located at a level that is the same as that of the second conductive layer 320.

The display device 400 and the driving circuit for driving the display device 400 are disposed in the display area DA on the substrate 100. The driving circuit may include the first TFT 210, the second TFT 220, and a storage capacitor Cst, and the storage capacitor Cst may include a first capacitor electrode CE1 and a second capacitor electrode CE2 that faces the first capacitor electrode CE1. According to an embodiment, the first gate electrode 213 may function as the first capacitor electrode CE1. In such an embodiment, the second capacitor electrode CE2 may overlap the first gate electrode 213 in a plan view, and may constitute the storage capacitor Cst along with the first gate electrode 213. A third gate insulating layer 113 disposed between the first gate electrode 213 and the second capacitor electrode CE2 may function as a dielectric layer of the storage capacitor Cst. According to an embodiment, the first TFT 210 and the storage capacitor Cst occupying large areas in a pixel overlap each other in a plan view, such that the capacity of the storage capacitor Cst may be increased without an additional space.

The first interlayer insulating layer 114 may be disposed on the second capacitor electrode CE2, and may include an inorganic material. The second active layer 221 of the second TFT 220 may be disposed on the first interlayer insulating layer 114. In such an embodiment, the second TFT 220 may be disposed over the second capacitor electrode CE2 of the storage capacitor Cst and the first gate electrode 213 of the first TFT 210.

The second gate electrode 223 may be disposed on the second active layer 221, and the second interlayer insulating layer 116 that covers the second gate electrode 223 and the first interlayer insulating layer 114 may be disposed on the second gate electrode 223. The first electrode 215 of the first TFT 210 may be disposed on the second interlayer insulating layer 116. A passivation layer 117 and the first planarization layer 118, which cover the second interlayer insulating layer 116 and the first electrode 215, may be sequentially stacked on the first electrode 215.

According to an embodiment, the passivation layer 117 and the first planarization layer 118 may respectively include an inorganic material and an organic material. The passivation layer 117 may protect the first electrode 215, and the first planarization layer 118 may planarize a surface. The passivation layer 117 including an inorganic material may not be disposed or provided in the bending area BA and a portion of the first area 1A adjacent to the bending area BA, and the first planarization layer 118 including an organic material may extend to the bending area BA.

A connection electrode 217 may be disposed on the first planarization layer 118, and may be connected to the first electrode 215 through a fifth contact hole CNT5 including openings defined in the passivation layer 117 and the first planarization layer 118, respectively. The second electrode 225 may be disposed on the first planarization layer 118, and may include the source electrode 225S connected to the second source region 221S of the second active layer 221 through the second contact hole CNT2 and the drain electrode 225D connected to the second drain region 221D of the second active layer 221 through the third contact hole CNT3.

The second electrode 225 including the source electrode 225S and the drain electrode 225D, the connection electrode 217, and the second conductive layer 320 may be disposed at a same level as each other and may include a same material as each other. The second electrode 225 including the source electrode 225S and the drain electrode 225D, the connection electrode 217, and the second conductive layer 320 are formed through a same mask process, which will be described later in greater detail.

Referring to FIG. 3B, in an embodiment, a plurality of through-holes TH is defined in at least portions of the first conductive layer 310 and the second conductive layer 320 in the bending area BA. In such an embodiment, the possibility that the first conductive layer 310 and the second conductive layer 320 are damaged due to bending may be effectively prevented or reduced by the plurality of through-holes TH. In such an embodiment, where the plurality of through-holes TH is defined in the first conductive layer 310 and the second conductive layer 320, the flexibility of the first conductive layer 310 and the second conductive layer 320 may be increased, and even when tensile stress is generated due to bending, disconnection or the like may be effectively prevented from occurring in the first conductive layer 310 and the second conductive layer 320.

The display device 400 may be disposed in the display area DA on the second planarization layer 119, and may include the pixel electrode 410, the intermediate layer 420 including an organic emission layer, and the counter electrode 430. A pixel-defining film 120 may be disposed on the second planarization layer 119. In such an embodiment, an opening, through which a central portion of the pixel electrode 410 is exposed, is defined through the pixel defining film 120 to define a pixel. In such an embodiment, the pixel-defining film 120 prevents an arc or the like from occurring at an edge of the pixel electrode 410 by increasing a distance between the edge of the pixel electrode 410 and the counter electrode 430 disposed over the pixel electrode 410. The pixel-defining film 120 may include or be formed of an organic material such as polyimide or HMDSO.

According to an embodiment, the pixel-defining film 120 may have a predetermined height large enough to define a pixel and to perform a spacer function for maintaining an interval between the counter electrode 430 and an encapsulation unit (not shown). The pixel-defining film 120 of FIG. 3A may have a two-stepped shape (or a shape having a upwardly protruding portion) to function as a spacer.

The pixel electrode 410 may be connected through a via-hole VIA defined in the second planarization layer 119 to the connection electrode 217, and the connection electrode 217 may be connected through the fifth contact hole CNT5 to the first electrode 215 of the first TFT 210. However, embodiments are not limited thereto, and the connection electrode 217 may be indirectly connected to the first electrode 215 through another TFT without being directly connected to the first electrode 215, and may be indirectly connected to the pixel electrode 410 through another TFT without being directly connected to the pixel electrode 410.

Figure 4A:
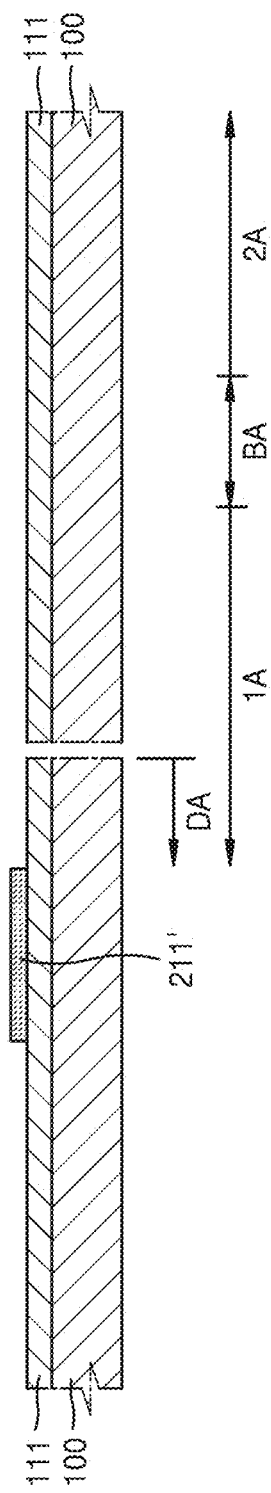
FIGS. 4A through 4O are cross-sectional views showing an embodiment of a method of manufacturing the display apparatus of FIG. 3A.
Figure 4B:
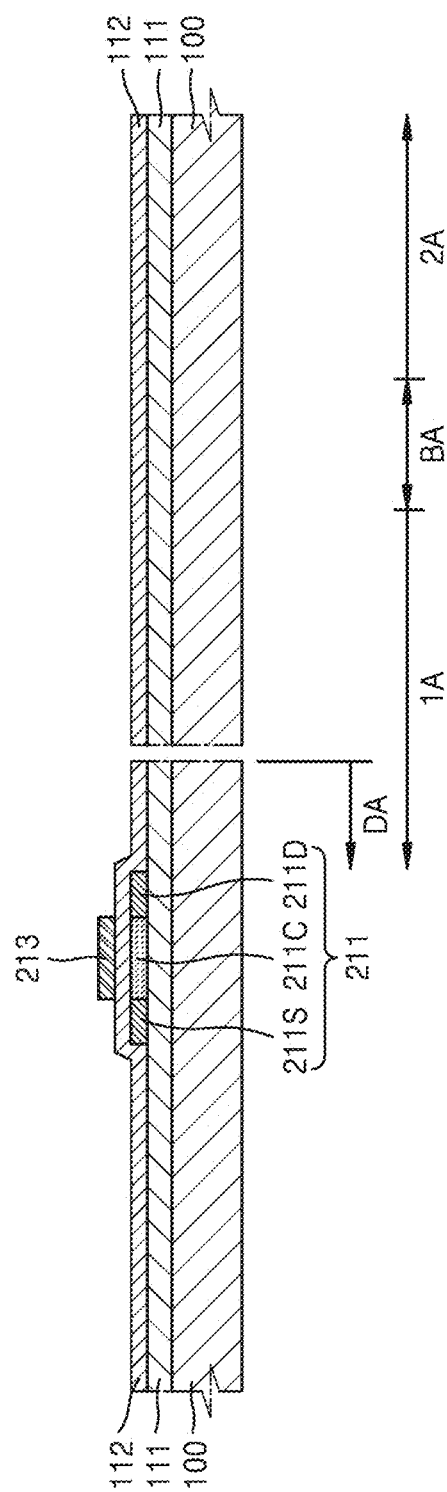
Figure 4C:
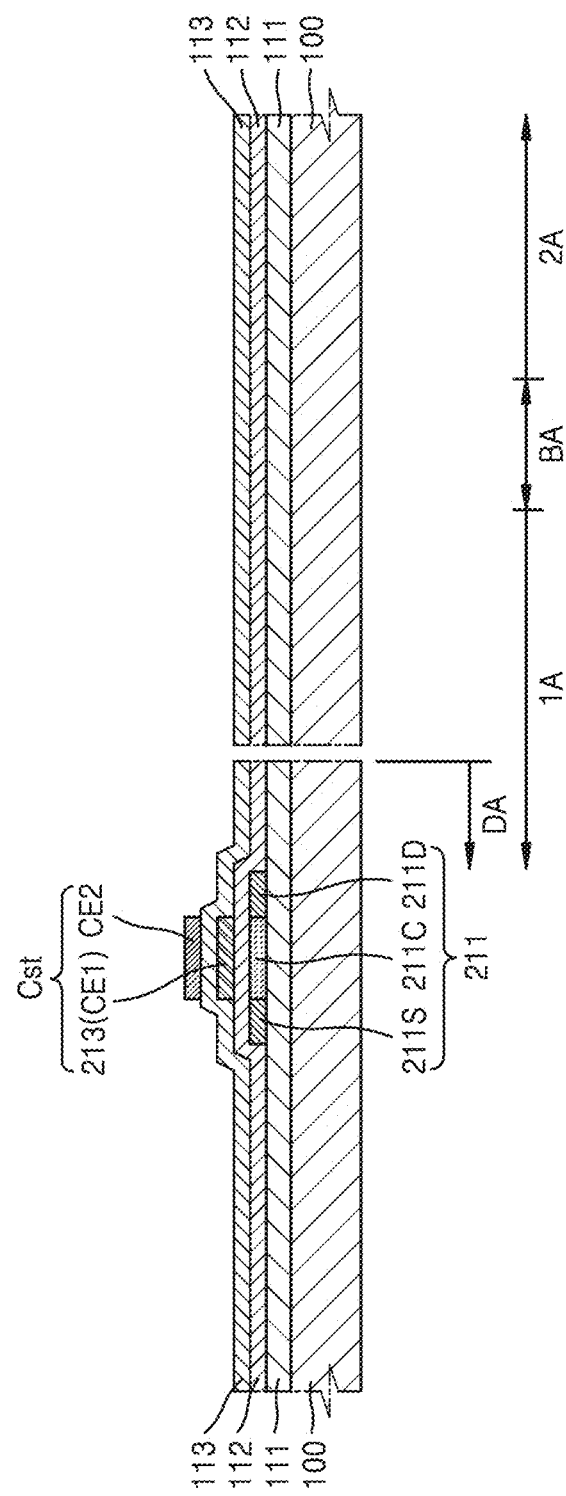
Figure 4D:
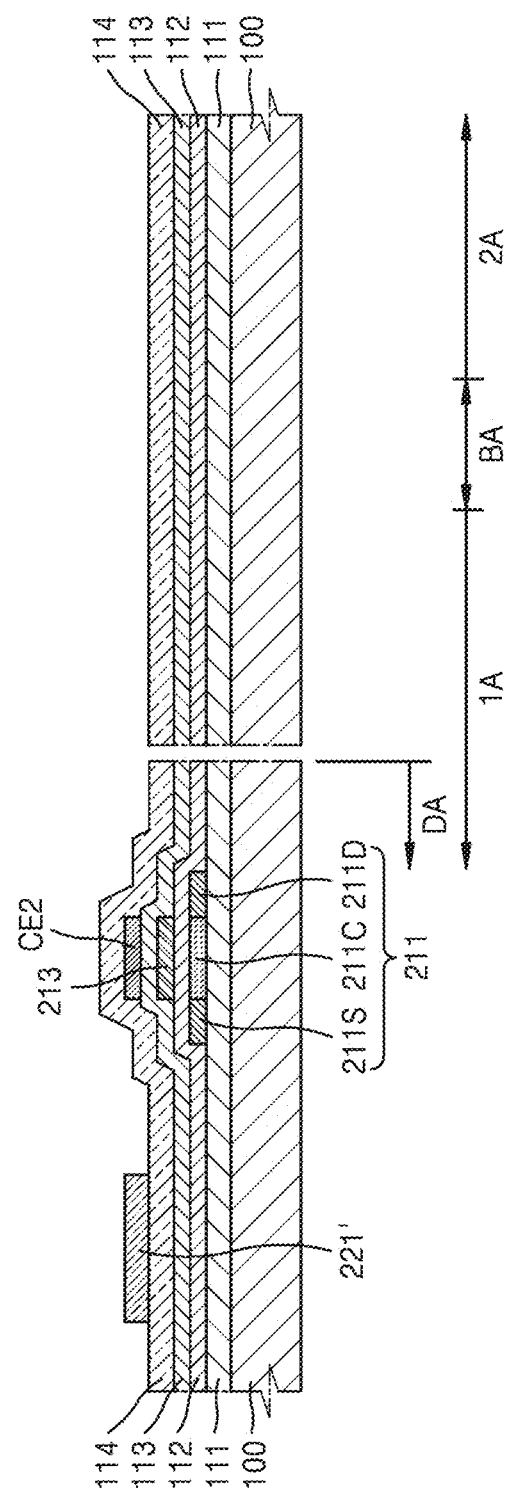
Figure 4E:
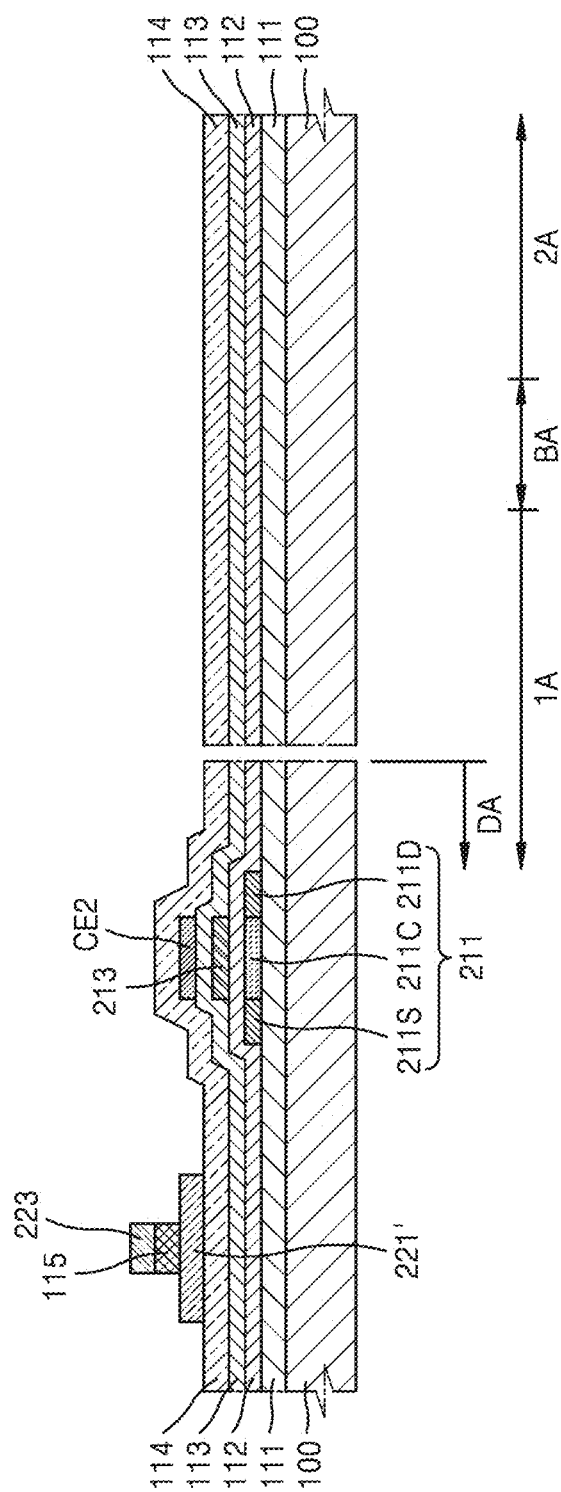
Figure 4F:
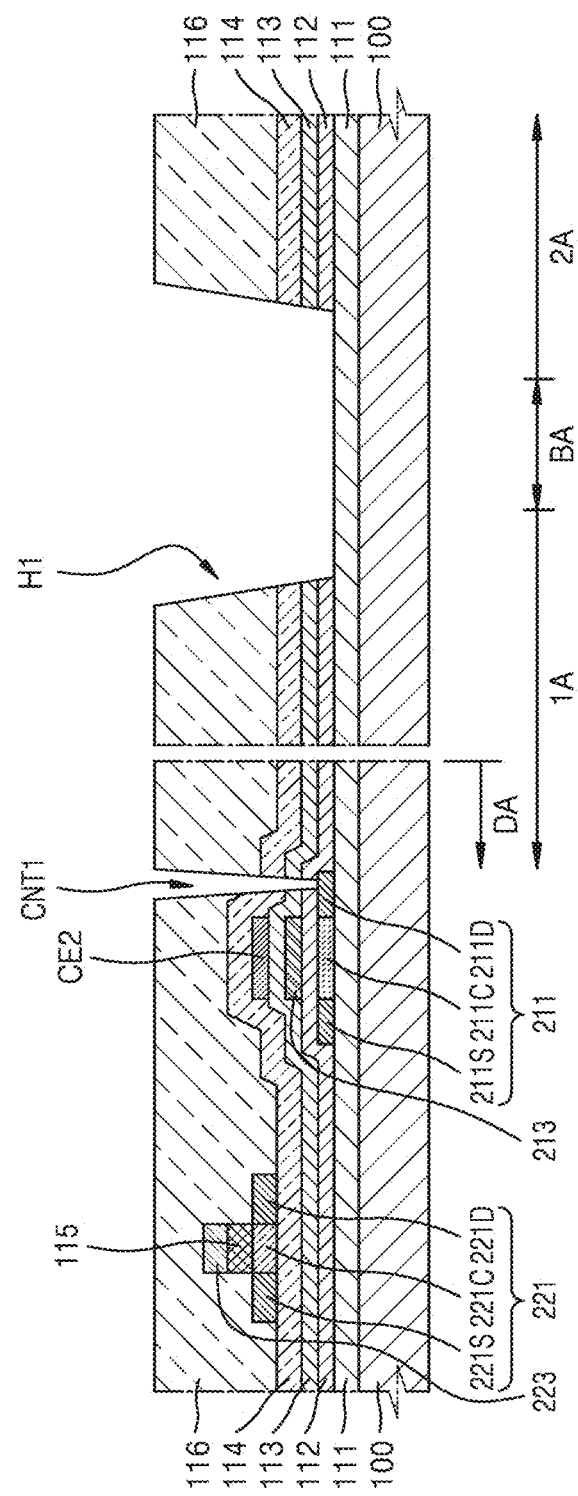
Figure 4G:
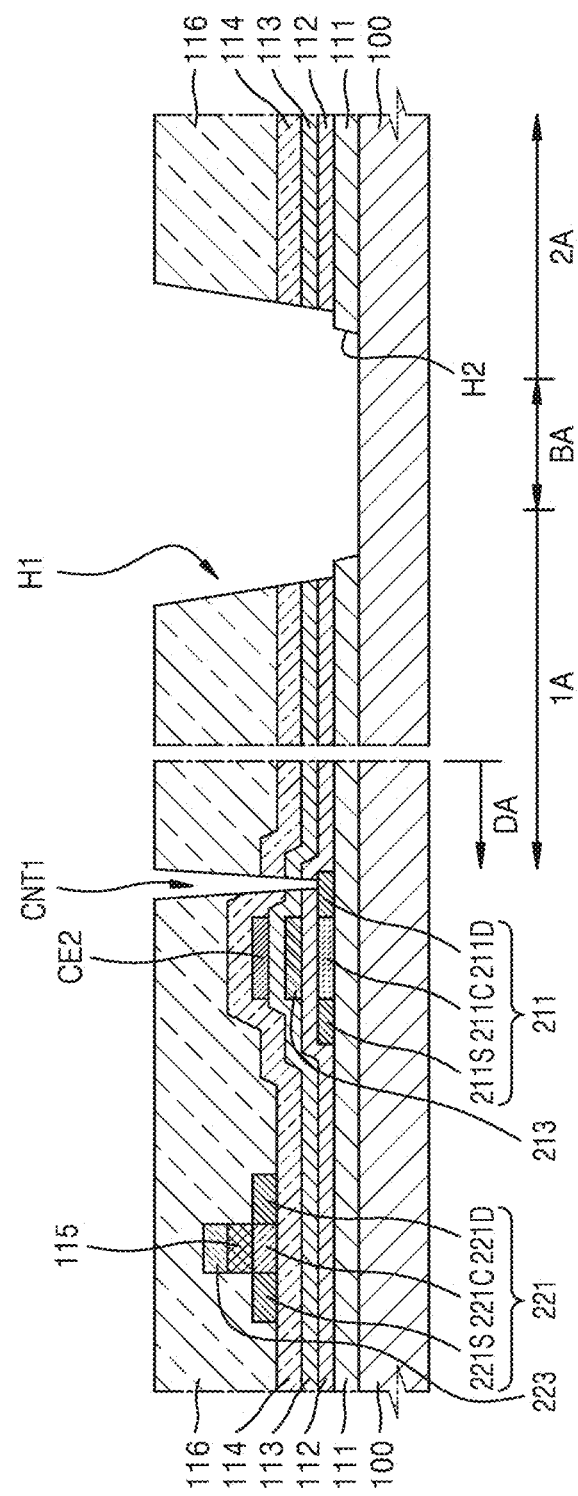
Figure 4H:
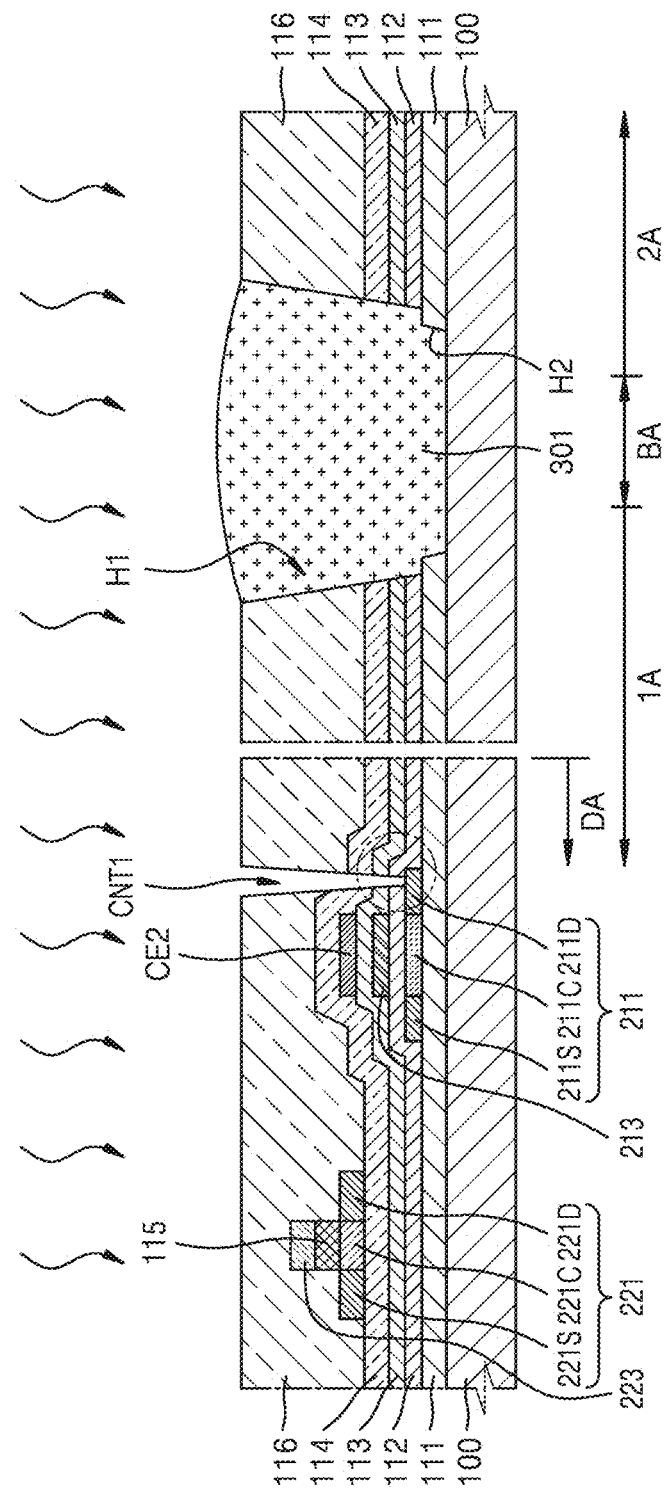
Figure 4I:
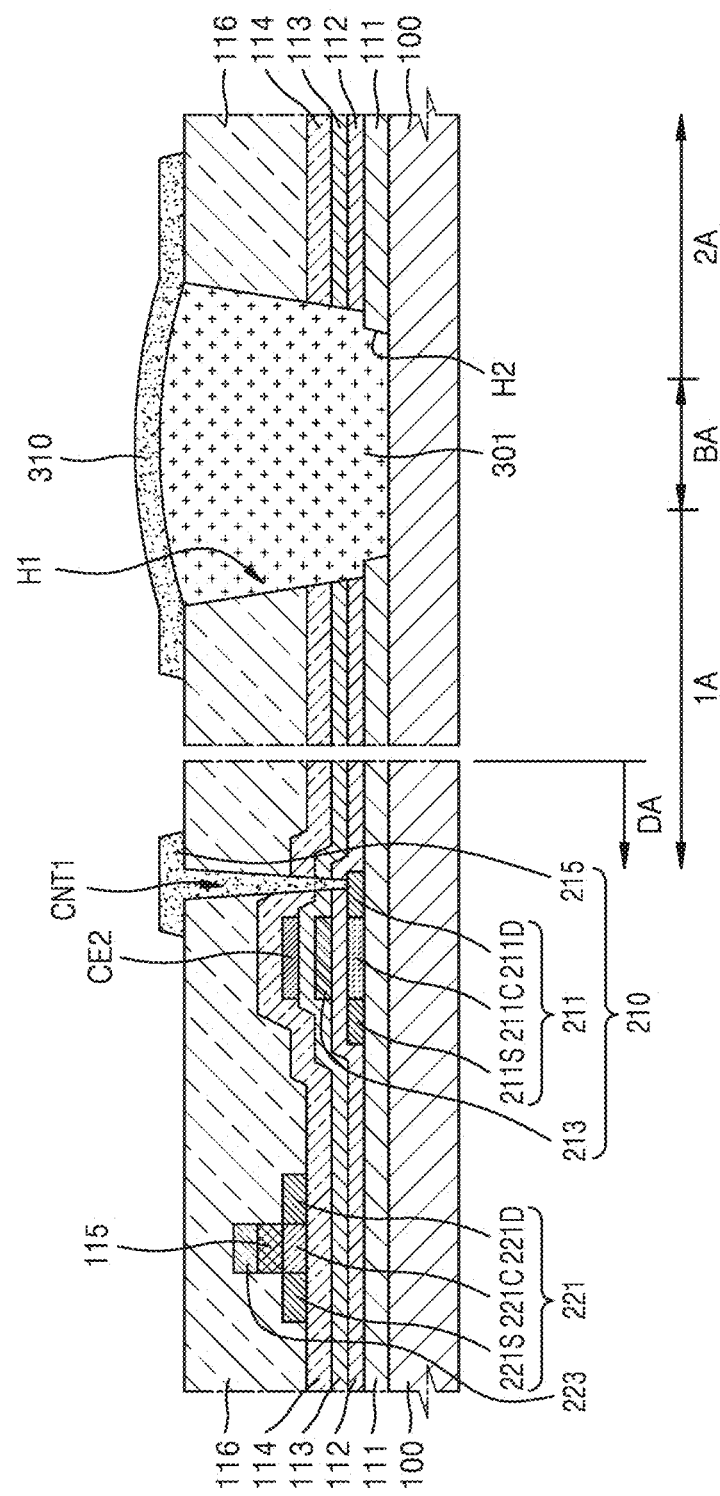
Figure 4J:
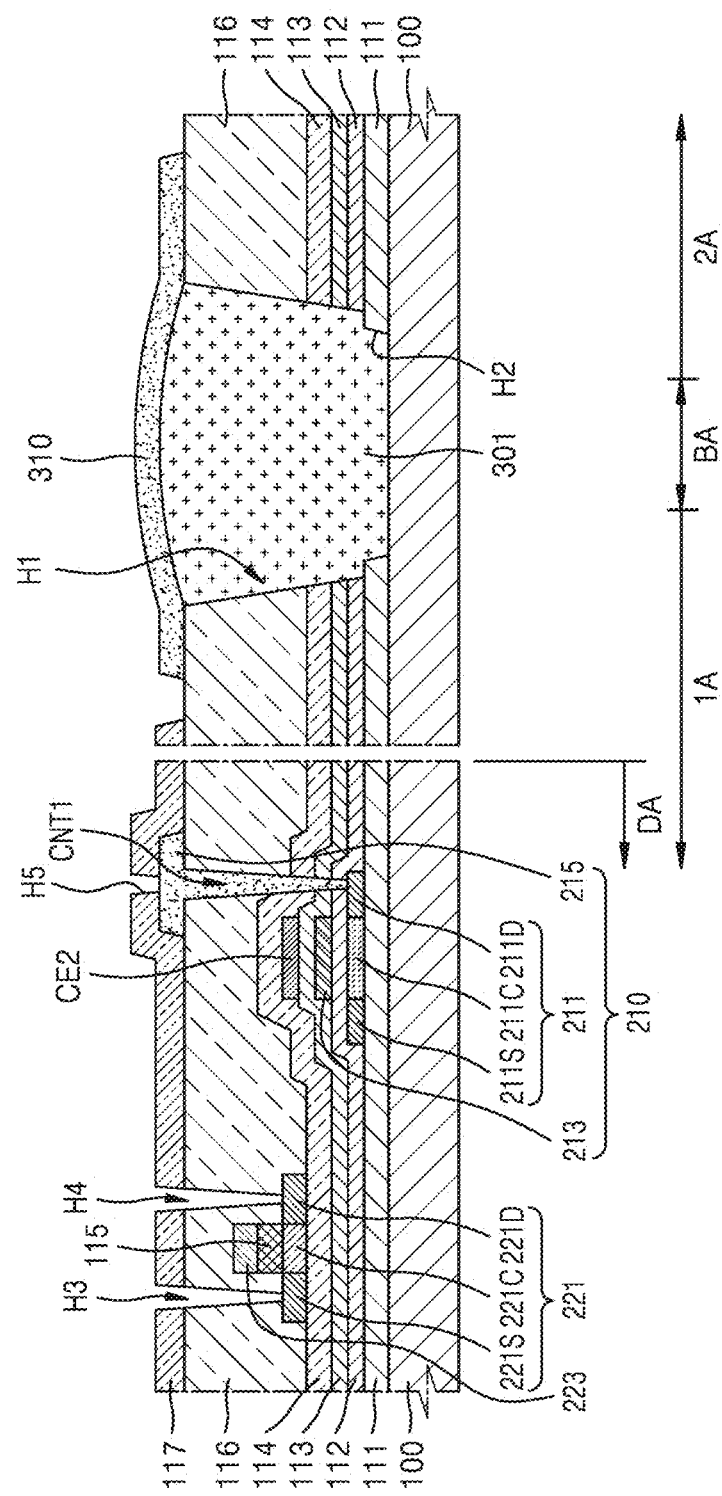
Figure 4K:
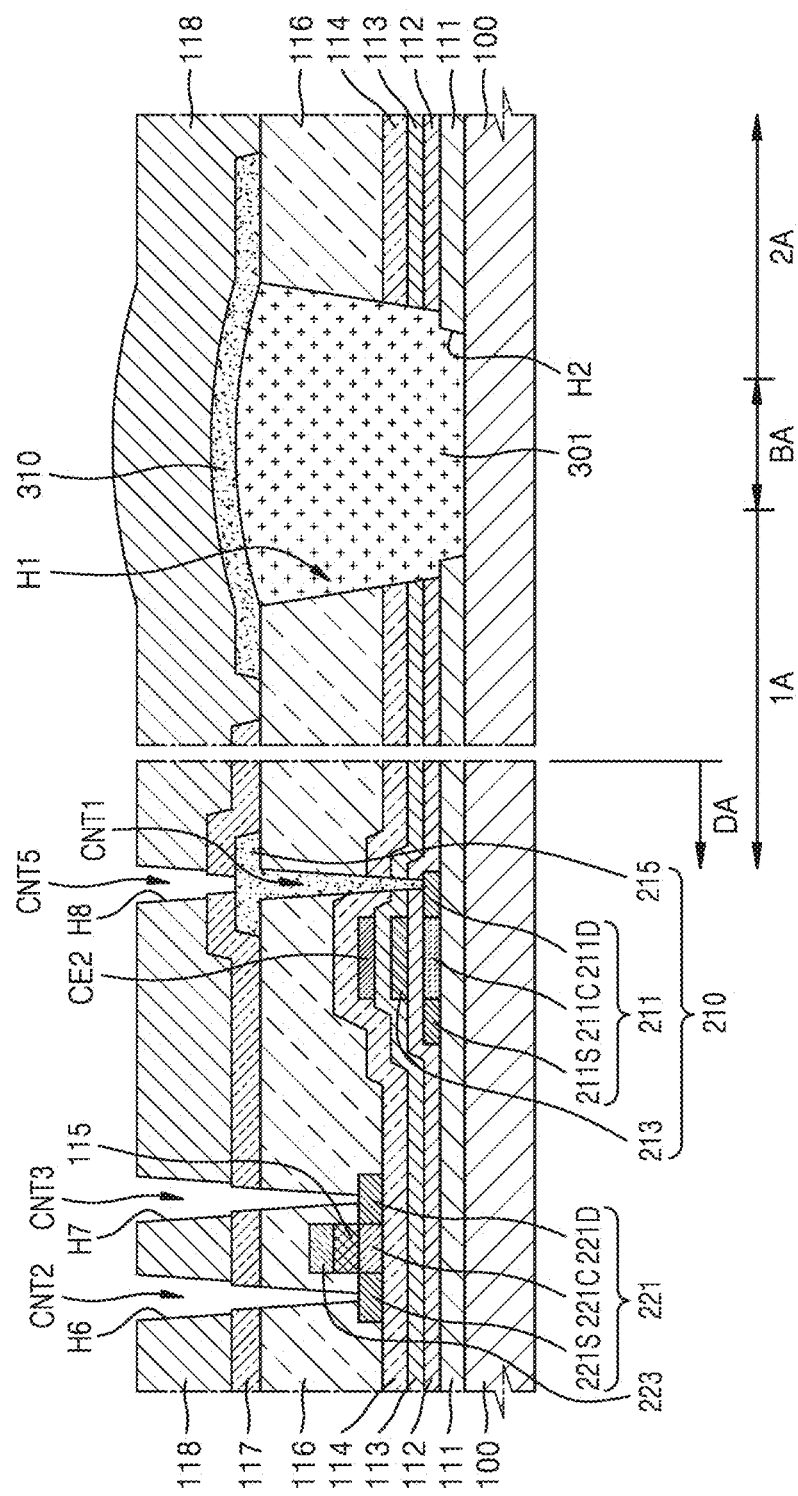
Figure 4L:
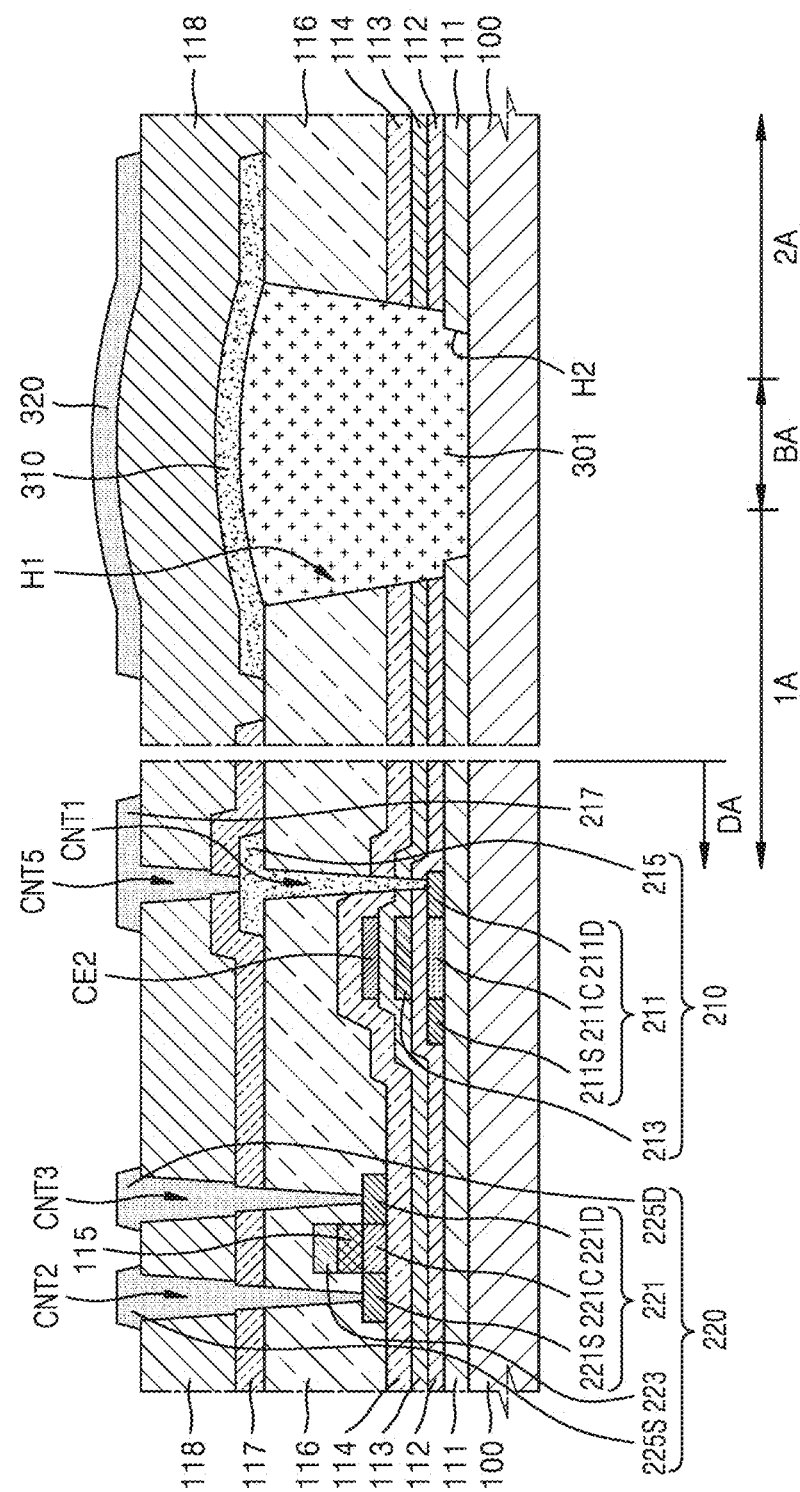
Figure 4M:
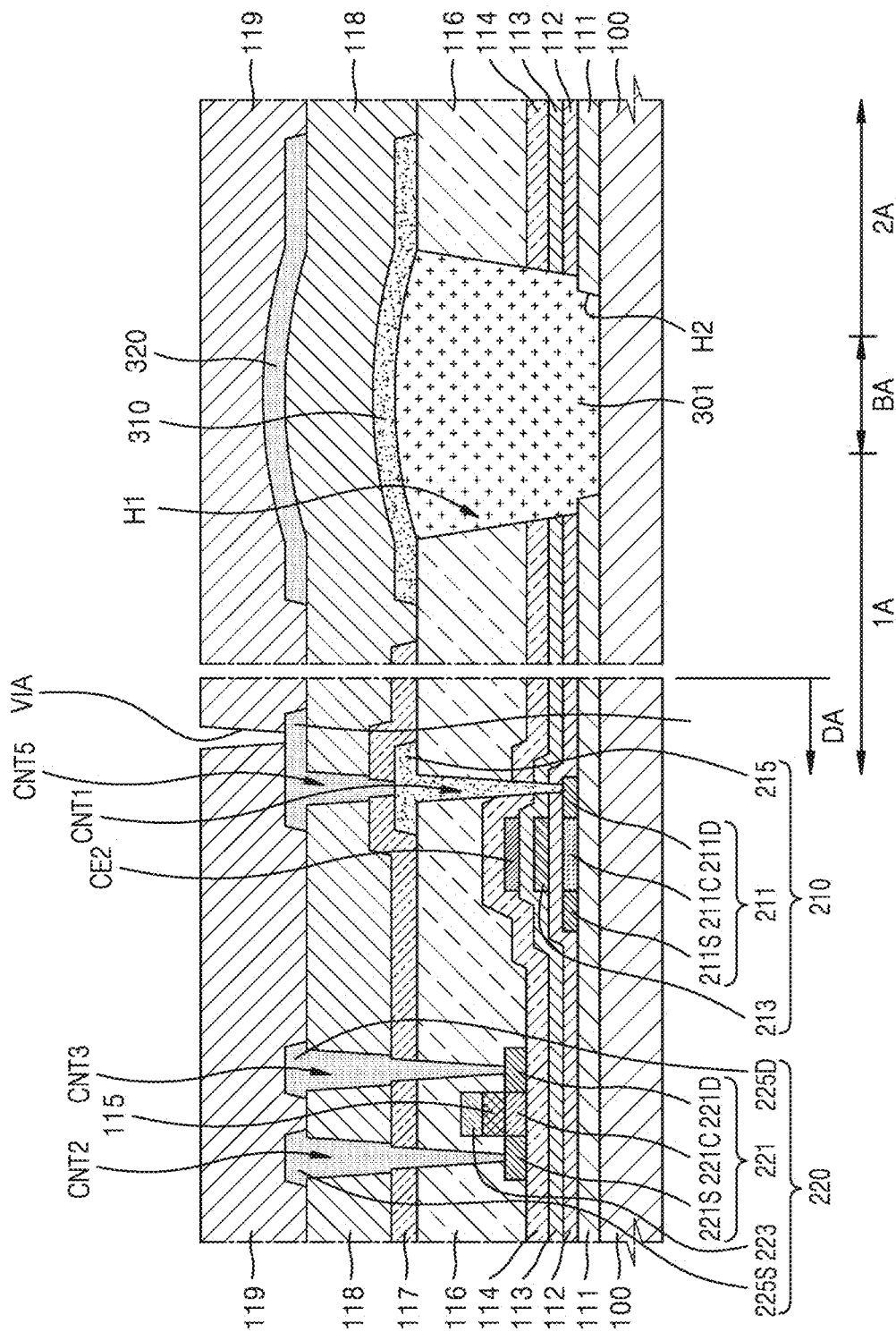
Figure 4N:
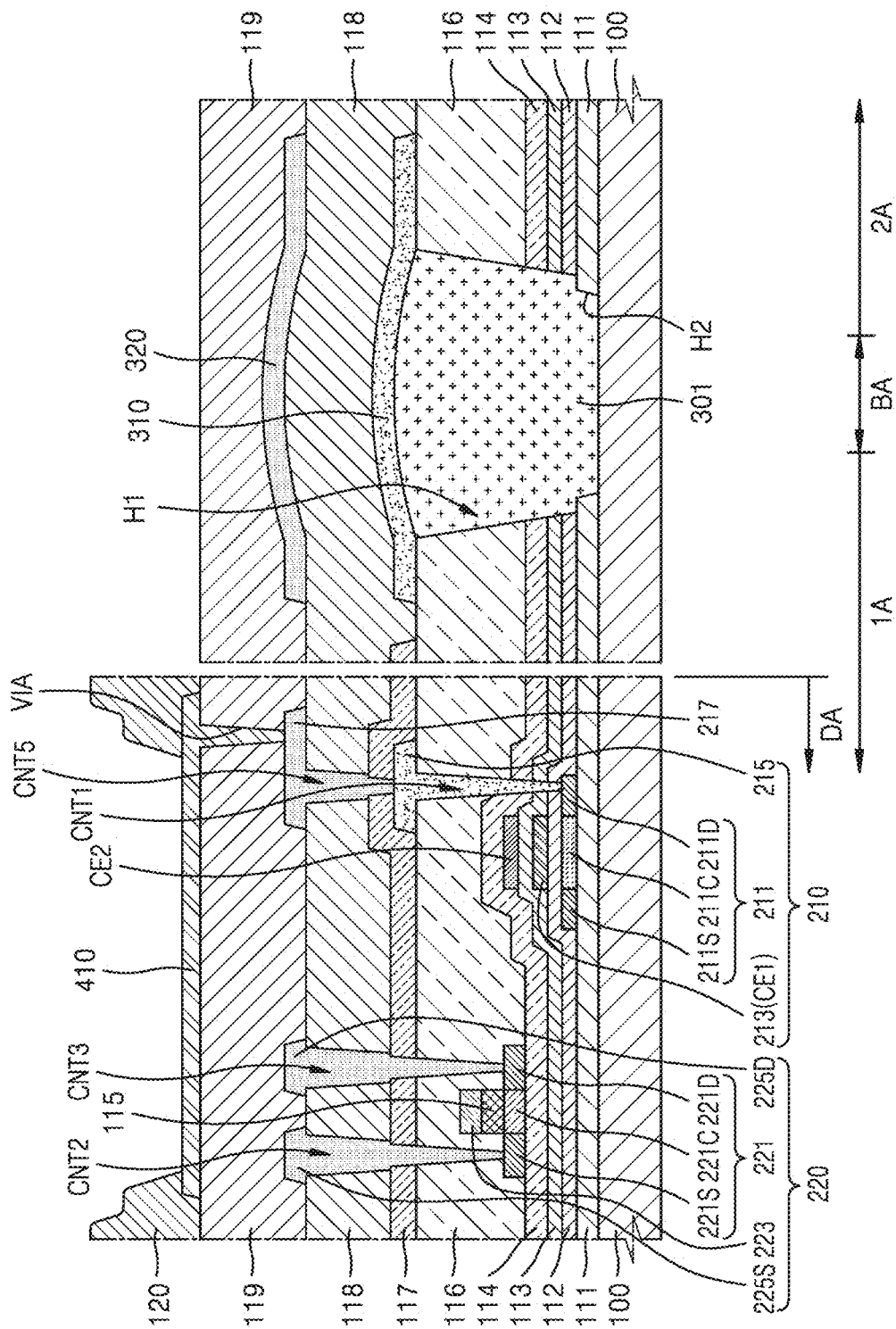
Figure 4O:
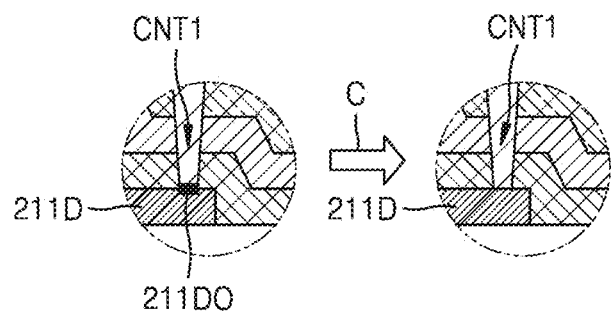

FIGS. 4A through 4O are cross-sectional views showing an embodiment of a method of manufacturing the display apparatus 2 of FIG. 3A. Processes corresponding to FIGS. 4A through 4N may be performed on the substrate 100 disposed on a carrier substrate (not shown), and the carrier substrate may be removed after the process of FIG. 4N.

Referring to FIG. 4A, the buffer layer 111 and a polycrystalline silicon layer 211' are provided or formed in the display area DA on the substrate 100. The substrate 100 may include the first area 1A, the second area 2A, and the bending area BA between the first area 1A and the second area 2A, and the first area 1A may include the display area DA. The buffer layer 111 may include an inorganic material such as silicon oxide, silicon nitride and/or silicon oxynitride, and may have a single or multi-layer structure.

The polycrystalline silicon layer 211' may be formed by forming non-crystalline silicon on an entire surface of the substrate 100 and annealing the non-crystalline silicon to form polycrystalline silicon, and then patterning the polycrystalline silicon using a first mask (not shown). However, embodiments are not limited thereto, and alternatively, the polycrystalline silicon layer 211' may be provided by directly providing or forming polycrystalline silicon on the entire surface of the substrate 100 and then patterning the polycrystalline silicon.

Referring to FIG. 4B, the first gate insulating layer 112 may be provided or formed on the buffer layer 111 to cover the polycrystalline silicon layer 211', and then the first gate electrode 213 may be provided or formed on the first gate insulating layer 112.

The first gate electrode 213 may be formed by coating a conductive material on the first gate insulating layer 112 and then patterning the conductive material using a second mask (not shown). In one embodiment, for example, the conductive material may include Mo.

After the first gate electrode 213 is provided on the first gate insulating layer 112, the first source region 211S and the first drain region 211D that are doped with impurities and are conductive may be provided by doping the polycrystalline silicon layer 211' with impurities by using the first gate electrode 213 as a shielding member, such that the first active layer 211 including the first source region 211S, the first drain region 211D, and the first channel region 211C that is not doped with impurities may be provided.

Referring to FIG. 4C, the third gate insulating layer 113 may be provided or formed on the first gate insulating layer 112 to cover the first gate electrode 213, and then the second capacitor electrode CE2 may be provided or formed on the third gate insulating layer 113. The second capacitor electrode CE2 constitutes the storage capacitor Cst along with the first gate electrode 213 that functions as the first capacitor electrode CE1. The second capacitor electrode CE2 may be provided or formed by coating a conductive material on the third gate insulating layer 113 and then patterning the conductive material by using a third mask (not shown).

In an alternative embodiment, where the display apparatus does not include the second capacitor electrode as shown in FIG. 1, the process of providing the second capacitor electrode CE2 of FIG. 4C may be omitted.

Referring to FIG. 4D, the first interlayer insulating layer 114 may be provided or formed on the third gate insulating layer 113 to cover the second capacitor electrode CE2, and then an oxide semiconductor layer 221' may be provided or formed on the first interlayer insulating layer 114. In an alternative embodiment, where the oxide semiconductor layer 221' is disposed on the third gate insulating layer 113 as shown in FIG. 1, the process of providing the first interlayer insulating layer 114 may be omitted.

According to an embodiment, the oxide semiconductor layer 221' may include indium-gallium-zinc oxide (In-GaZnO), and the oxide semiconductor layer 221' may be formed by coating an oxide semiconductor on the first interlayer insulating layer 114 and then patterning the oxide semiconductor by using a fourth mask (not shown). In such an embodiment, since the oxide semiconductor layer 221' is formed after the first gate electrode 213 and the second capacitor electrode CE2 are formed, the oxide semiconductor layer 221' may be located at a level higher than that of the first gate electrode 213.

Referring to FIG. 4E, the second gate insulating layer 115 and the second gate electrode 223 may be provided or formed on the oxide semiconductor layer 221'. The second gate insulating layer 115 and the second gate electrode 223 may be formed by sequentially coating an insulating material and a conductive material on the first interlayer insulating layer 114 and then simultaneously patterning the insulating material and the conductive material using a fifth mask (not shown). In such an embodiment, since the second gate insulating layer 115 and the second gate electrode 223 are simultaneously formed by using a same mask (i.e., the fifth mas), the second gate insulating layer 115 and the second gate electrode 223 may have the substantially same area (or same planar shape) as each other.

Referring to FIG. 4F, the second interlayer insulating layer 116 may be provided or formed on the first interlayer insulating layer 114 to cover the oxide semiconductor layer 221', the second gate insulating layer 115 and the second gate electrode 223, and then the second source region 221S and the second drain region 221D may be formed by doping the oxide semiconductor layer 221' with impurities by using the second gate electrode 223 as a shielding member. In such an embodiment, the second active layer 221 including the second source region 221S, the second drain region 221D, and the second channel region 221C that is not doped with impurities may be formed.

In an embodiment, the first contact hole CNT1, through which the first drain region 211D of the first active layer 211 is exposed, and the first opening H1 corresponding to at least the bending area BA and through which the buffer layer 111 is exposed may be formed by simultaneously removing corresponding portions of the first gate insulating layer 112, the third gate insulating layer 113, the first interlayer insulating layer 114 and the second interlayer insulating layer 116 using a sixth mask (not shown).

Referring to FIG. 4G, the second opening H2 may be formed in the buffer layer 111 by removing at least a portion of the buffer layer 111 exposed through the first opening H1 by using a seventh mask (not shown). Accordingly, the second opening H2 may overlap the first opening H1 in a plan view, and may be formed to correspond to at least the bending area BA.

Referring to FIG. 4H, the bending organic layer 301 may be provided or formed in the first opening H1 and the second opening H2 by using an eighth mask (not shown). In such an embodiment, the bending organic layer 301 may be filled in both the first opening H1 and the second opening H2 in FIG. 3A, but not being limited thereto.

In the process of FIG. 4H, before or after the bending organic layer 301 is formed, the first active layer 211 may be annealed. FIG. 4O is an enlarged view of the encircled portion of FIG. 4H. The annealing may be a process for increasing a carrier mobility of the first active layer 211 by applying heat to the first active layer 211, and as shown in FIG. 4O, an oxide film 211DO may be formed on a surface of the first drain region 211D of the first active layer 211 that is exposed through the first contact hole CNT1 during the annealing. In such an embodiment, as shown in FIG. 4O, a cleaning process C may be further performed after the annealing to remove the oxide film 211DO formed on the surface of the first drain region 211D. In such an embodiment, a buffered oxide etchant ("BOE") may be used as a cleaning solution.

The BOE is capable of etching an oxide semiconductor, and the second active layer 221 including an oxide semiconductor may be protected by the second interlayer insulating layer 116 in a process of forming the first contact hole CNT1 as shown in FIG. 4H.

Referring to FIG. 4I, the first electrode 215 and the first conductive layer 310 are formed on the second interlayer insulating layer 116 and the bending organic layer 301. The first electrode 215 and the first conductive layer 310 may be simultaneously formed by forming a conductive material on the second interlayer insulating layer 116 and the bending organic layer 301 and patterning the conductive material by using a ninth mask (not shown). Accordingly, the first electrode 215 and the first conductive layer 310 may be located at a same level as each other and may include a same material as each other. In one embodiment, for example, each of the first electrode 215 and the first conductive layer 310 may have a three-layer structure in which Ti, Al and Ti are sequentially stacked on one another.

According to an embodiment, a time for which the first drain region 211D is exposed to the air may be minimized, and the first drain region 211D may be hardly affected by subsequent processes by forming the first electrode 215 that is filled in the first contact hole CNT1 and contacts the first drain region 211D of the first active layer 211 right after the cleaning C of FIG. 4H.

Referring to FIG. 4J, the passivation layer 117 may be provided or formed on the second interlayer insulating layer 116 to cover the first electrode 215. The passivation layer 117 includes an inorganic material, and is not provided in at least the bending area BA. In an embodiment, as shown in FIG. 4J, the passivation layer 117 may not be provided on the first conductive layer 310.

The passivation layer 117 may be formed by coating an insulating material on the second interlayer insulating layer 116 and the bending organic layer 301 to cover the first electrode 215 and the first conductive layer 310, and then patterning the insulating material by using a tenth mask (not shown). During the patterning, a fifth opening H5 through which the first electrode 215 is exposed may be formed by removing the insulating material in at least the bending area BA. In such an embodiment, a third opening H3 and a fourth opening H4 through which the second source region 221S and the second drain region 221D of the second active layer 221 are respectively exposed may be formed by simultaneously removing the second interlayer insulating layer 116 and the second gate insulating layer 115 thereunder.

In a process of providing the second interlayer insulating layer 116 and the passivation layer 117, a photoresist may be formed on the insulating material, and then exposure, developing and stripping may be sequentially performed by using a tenth mask (not shown) including a pattern corresponding to a portion to be removed. If the first electrode 215 is not formed in a previous operation, a solution used in the stripping may penetrate into the first drain region 211D of the first active layer 211 including polycrystalline silicon and may oxidize a surface of the first drain region 211D. However, in an embodiment, since the first electrode 215 is formed before the operation of FIG. 4J, a solution used in the stripping does not penetrate into the first active layer 211 and thus the surface of the first drain region 211D may be effectively prevented from being oxidized.

In an embodiment of a method of manufacturing the display apparatus 1 of FIG. 2, a process of providing the passivation layer 117 may be omitted, and only a process of forming openings, through which the second source region 221S and the second drain region 221D of the second active layer 221 are exposed, in the second interlayer insulating layer 116 may be performed.

Referring to FIG. 4K, the first planarization layer 118 may be provided or formed on the second interlayer insulating layer 116 to cover the passivation layer 117 and the first conductive layer 310. The first planarization layer 118 may be formed by forming an organic insulating material on the second interlayer insulating layer 116 to cover the passivation layer 117 and the first conductive layer 310, and then forming a sixth opening H6 and a seventh opening H7 to overlap the third opening H3 and the fourth opening H4 and forming an eighth opening H8 to overlap the fifth opening H5 by using an eleventh mask (not shown).

In such an embodiment, the third opening H3 and the sixth opening H6 that overlap each other may constitute the second contact hole CNT2 through which the second source region 221S of the second active layer 221 is exposed, and the fourth opening H4 and the seventh opening H7 may constitute the third contact hole CNT3 through which the second drain region 221D of the second active layer 221 is exposed. In such an embodiment, the fifth opening H5 and the eighth opening H8 may constitute the fifth contact hole CNT5 through which the first electrode 215 is exposed. In an embodiment of a method of manufacturing the display apparatus 1 of FIG. 2, the process of forming the fifth contact hole CNT5 may not be omitted, and the process of forming the fourth contact hole CNT4 through which the first conductive layer 310 may be performed.

In an embodiment, as described above, the passivation layer 117 is formed of an inorganic material and the first planarization layer 118 is formed of an organic material, but not being limited thereto. In an alternative embodiment, the passivation layer 117 may be omitted as shown in FIG. 2, and in another alternative embodiment, the passivation layer 117 may be formed of an organic material and the first planarization layer 118 may be formed of an inorganic material. In such an embodiment, the passivation layer 117 may be provided in the bending area BA, and the first planarization layer 118 may not be provided in the bending area BA.

Referring to FIG. 4L, the second electrode 225 including the source electrode 225S and the drain electrode 225D, the connection electrode 217, and the second conductive layer 320 may be provided or formed on the first planarization layer 118. The second electrode 225 including the source electrode 225S and the drain electrode 225D, the connection electrode 217, and the second conductive layer 320 may be simultaneously formed by forming a conductive material on the first planarization layer 118 and then patterning the conductive material by using a twelfth mask (not shown). In such an embodiment, the second electrode 225 including the source electrode 225S and the drain electrode 225D, the connection electrode 217, and the second conductive layer 320 may be provided at a same level (in a same layer or directly on a same layer) as each other and may be formed of a same material as each other. In one embodiment, for example, each of the second electrode 225 including the source electrode 225S and the drain electrode 225D, the connection electrode 217, and the second conductive layer 320 may have a three-layer structure in which Ti, Al and Ti are sequentially stacked on one another.

The second electrode 225 may include the source electrode 225S, which is filled in the second contact hole CNT2 and contacts the second source region 221S of the second active layer 221, and the drain electrode 225D, which is filled in the third contact hole CNT3 and contacts the second drain region 221D of the second active layer 221. The connection electrode 217 may be filled in the fifth contact hole CNT5 and may contact the first electrode 215, and the second conductive layer 320 may be electrically connected to the first conductive layer 310 as shown in FIG. 2. In an embodiment of a method of manufacturing the display apparatus 1 of FIG. 2, the process of providing the connection electrode 217 may be omitted.

As described above, although FIG. 3A illustrates a display apparatus 2 in a state where the display apparatus 2 is not bent for convenience, in an embodiment of the display apparatus 2, the substrate 100 or the like is actually bent in the bending area BA as shown in FIG. 1. In an embodiment, during a manufacturing process, the display apparatus 2 is manufactured in a state where the substrate 100 is substantially flat as shown in FIG. 3A, and then the display apparatus 2 has a shape as shown in FIG. 1 by bending the substrate 100 or the like in the bending area BA. In such an embodiment, when the substrate 100 or the like is bent in the bending area BA, tensile stress may be applied to the first conductive layer 310 and the second conductive layer 320. However, in such an embodiment of the display apparatus 2, defects may be prevented or suppressed from occurring in the first conductive layer 310 and the second conductive layer 320 when the substrate 100 or the like is bent.

If openings are not defined in inorganic insulating layers such as the buffer layer 111, the first gate insulating layer 112, the third gate insulating layer 113, the first interlayer insulating layer 114 and the second interlayer insulating layer 116 at portions thereof in the bending area BA, the inorganic insulating layers continuously extend from the first area 1A to the second area 2A, and the first conductive layer 310 and the second conductive layer 320 are provided on the inorganic insulating layers, large tensile stress is applied to the first conductive layer 310 and the second conductive layer 320 when the substrate 100 or the like is bent. In particular, since a stiffness of the inorganic insulating layers is greater than that of layers including an organic material, the possibility that cracks may occur in the inorganic insulating layers in the bending area BA is very high. Once cracks occur in the inorganic insulating layers, the possibility that cracks occur in the first conductive layer 310 and the second conductive layer 320 on the inorganic insulating layers and disconnection or the like occurs in the first conductive layer 310 and the second conductive layer 320 is also very high.

In an embodiment of the display apparatus 2 according to the invention, openings are defined in portions of the inorganic insulating layers in the bending area BA, and portions of the first conductive layer 310 and the second conductive layer 320 in the bending area BA are disposed on the bending organic layer 301 that is filled in at least parts of the openings of the inorganic insulating layers as described above. Since a stiffness of the bending organic layer 301 is less than that of an inorganic layer, the bending organic layer 301 may absorb tensile stress generated when the substrate 100 or the like is bent, thereby effectively minimizing concentration of tensile stress on the first conductive layer 310.

Although the inorganic insulating layers include the openings in FIG. 3A, embodiments are not limited thereto. In one embodiment, for example, the inorganic insulating layers may include grooves, instead of openings. In one embodiment, for example, the buffer layer 111 may extend from the first area 1A through the bending area BA to the second area 2A without including the first opening H1, and only the second opening H2 is defined in the first gate insulating layer 112, the third gate insulating layer 113, the first interlayer insulating layer 114 and the second interlayer insulating layer 116. casein such an embodiment, the first gate insulating layers 112, the third gate insulating layer 113, the first interlayer insulating layer 114 and the second interlayer insulating layer 116, each including an inorganic material, may be collectively referred to as inorganic insulating layers. Herein, the inorganic insulating layers may be understood as including grooves corresponding to the bending area BA. In such an embodiment, the bending organic layer 301 may be filled in at least parts of the grooves.

In such an embodiment, since the inorganic insulating layers include grooves in the bending area BA, a thickness of the inorganic insulating layers in the bending area BA may be reduced, thereby allowing the substrate 100 or the like to be easily bent. In such an embodiment, since the bending organic layer 301 is disposed in the bending area BA and the first conductive layer 310 is disposed on the bending organic layer 301, the first conductive layer 310 may be effectively prevented from being damaged due to bending. In such an embodiment, the second conductive layer 320 may be further provided in the bending area BA just in case disconnection occurs in the first conductive layer 310. In such an embodiment, only the first planarization layer 118 including an organic material may be disposed between the first conductive layer 310 and the second conductive layer 320.

Referring to FIG. 4M, the second planarization layer 119 may be provided or formed on the first planarization layer 118 to cover the second electrode 225 including the source electrode 225S and the drain electrode 225D, the connection electrode 217, and the second conductive layer 320. The second planarization layer 119 may be formed by forming an organic material on the first planarization layer 118 to cover the second electrode 225 including the source electrode 225S and the drain electrode 225D, the connection electrode 217, and the second conductive layer 320, and then forming a via-hole VIA, through which the connection electrode 217 is exposed, by patterning the organic material by using a thirteenth mask (not shown).

Referring to FIG. 4N, the pixel electrode 410 may be provided or formed in the display area DA on the second planarization layer 119 by using a fourteenth mask (not shown), and then the pixel-defining film 120, in which an opening that exposes a part of the pixel electrode 410 is defined, may be formed by using a fifteenth mask (not shown).

The pixel electrode 410 may be filled in the via-hole VIA and may contact the connection electrode 217. However, embodiments are not limited thereto, and alternatively, a portion where the connection electrode 217 and the pixel electrode 410 are connected to each other may not be on the first TFT 210. In such an embodiment, as described above, the first TFT 210 and the pixel electrode 410 may be connected to each other through another TFT, and the connection electrode 217 may be provided adjacent to the other TFT.

Referring back to FIG. 3A, the display device 400 may be provided or formed in the display area DA by forming the intermediate layer 420 including the organic emission layer on the pixel electrode 410 and forming the counter electrode 430 on the intermediate layer 420.

According to an embodiment of the method of manufacturing the display apparatus 2, since the first electrode 215 and the first conductive layer 310 are simultaneously formed by using a same mask and the second electrode 225 including the source electrode 225S and the drain electrode 225D, the connection electrode 217, and the second conductive layer 320 are simultaneously formed by using a same mask, the number of masks may be reduced and double wiring may be formed in the bending area BA.

In an embodiment, since patterning is performed to expose the second source region 221S and the second drain region 221D of the second active layer 221 as shown in FIG. 4J in a state where the first electrode 215 is formed and the first drain region 211D of the first active layer 211 is completely covered as shown in FIG. 4I, oxidation of the first drain region 211D during the patterning of FIG. 4J may be effectively prevented. In such an embodiment, an increase in contact resistance between the first drain region 211D and the first electrode 215 due to oxidation of a surface of the first drain region 211D may be effectively prevented.

Figure 5:
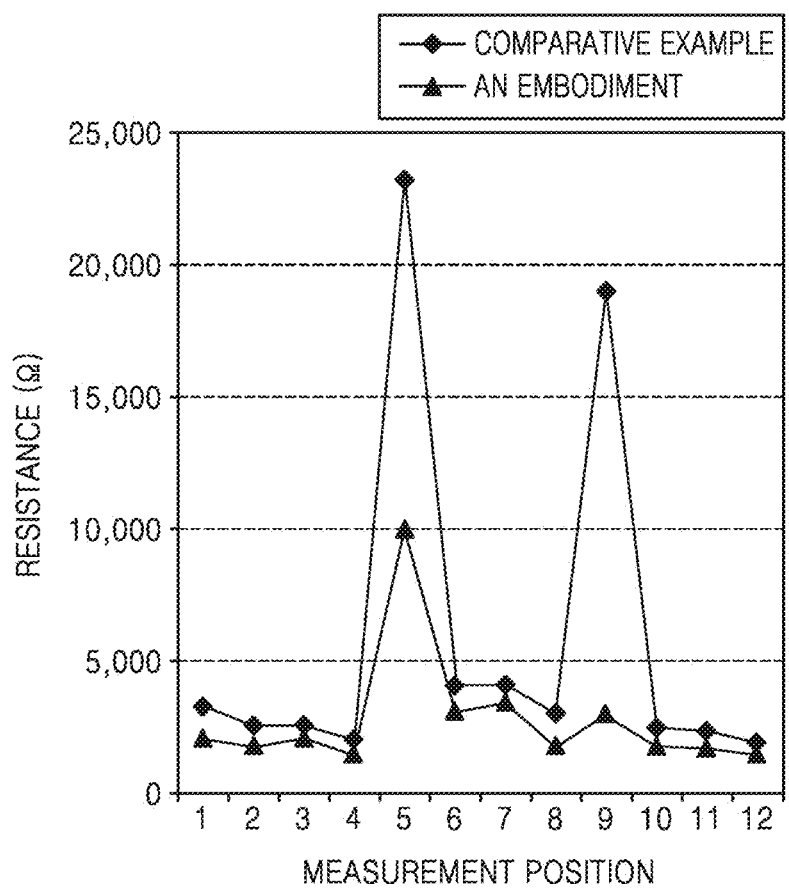
FIG. 5 is a graph illustrating contact resistance between a first drain region and a first electrode, according to an embodiment and a comparative example.

FIG. 5 is a graph illustrating contact resistance between the first drain region 211D and the first electrode 215 according to an embodiment and a comparative example.

The embodiment corresponds to a case where, a patterning process for exposing the second source region 221S and the second drain region 221D of the second active layer 221 is performed as shown in FIG. 4J in a state where the first electrode 215 is formed and the first drain region 211D of the first active layer 211 is completely covered as shown in FIG. 4I, as described above. The comparative example corresponds to a case where, the operation of FIG. 4J is performed in a state where the first electrode 215 is not formed and the first drain region 211D of the first active layer 211 is thereby exposed.

The horizontal axis represents a measurement position of the first drain region 211D and the vertical axis represents a contact resistance value. As shown in the graph of FIG. 5, in the comparative example, a surface of the first drain region 211D is oxidized due to a solution used in the stripping of FIG. 4J and contact resistance is thereby increased.

Figure 6:
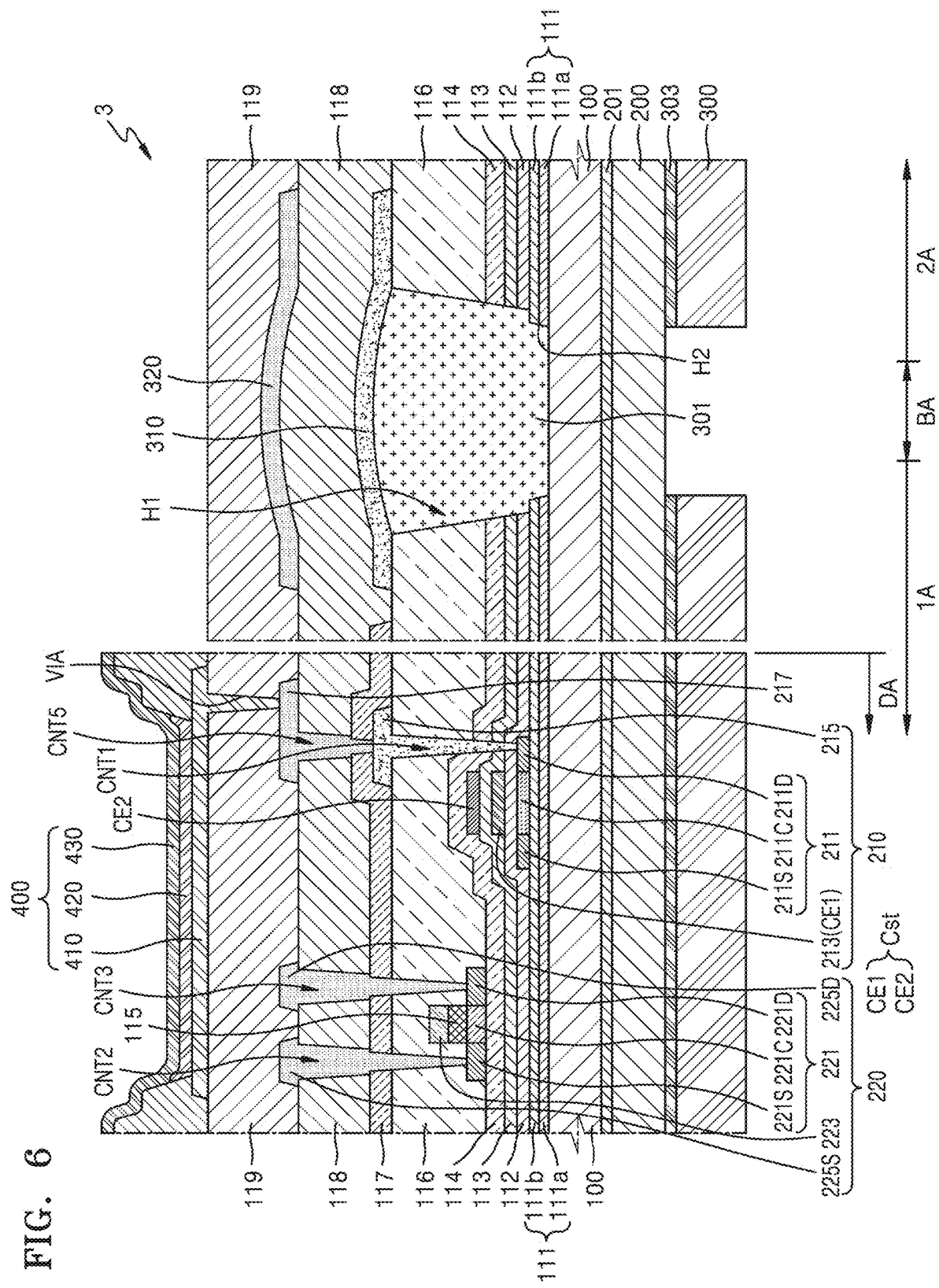
FIG. 6 is a cross-sectional view of a display apparatus according to another alternative embodiment.

FIG. 6 is a cross-sectional view of a display apparatus 3 according to an alternative embodiment. The display apparatus 3 of FIG. 6 is substantially the same as the display apparatus 2 of FIG. 3A except for some differences described below. The same or like elements shown in FIG. 7 have been labeled with the same reference characters as used above to describe the embodiments of the display apparatus 2 shown in FIG. 3A, and any repetitive detailed description thereof will hereinafter be omitted or simplified.

In an embodiment, as shown in FIG. 6, the buffer layer 111 may be located on the substrate 100, and may include a first lower buffer layer 111a and a first upper buffer layer 111b. Each of the first lower buffer layer 111a and the first upper buffer layer 111b may include an inorganic material such as silicon oxide, silicon nitride, and/or silicon oxynitride.

In such an embodiment, as shown in FIG. 6, a lower substrate 200 may be disposed under the substrate 100, and a barrier layer 201 may be disposed between the substrate 100 and the lower substrate 200. The lower substrate 200 may include a material that is the same as that of the substrate 100.

In an embodiment, each of the substrate 100 and the lower substrate 200 may be a flexible substrate that may be easily bent, and may include a polymer resin such as PES, PAR, PEI, PEN, PET, PPS, PI, PC, or CAP. In one embodiment, for example, each of the substrate 100 and the lower substrate 200 may include or be formed of PI having high bendability and may have a thickness in a range from several to tens of μm.

A support substrate 300 is disposed under the lower substrate 200. The support substrate 300 may include a portion disposed in the first area 1A under the substrate 100 and a portion disposed in the second area 2A under the substrate 100, and the two portions may be completely spaced apart from each other. In such an embodiment, the support substrate 300 may not be disposed in the bending area BA. According to an embodiment, the support substrate 300 may not be disposed in a part of the first area 1A and a part of the second area 2A in addition to the bending area BA. A distance between the two portions of the support substrate 300 that are spaced apart from each other may be greater than a width of the bending area BA.

The support substrate 300 may have a stiffness greater than that of the substrate 100 and the lower substrate 200, and may include a polymer resin such as PES, PAR, PEI, PEN, PET, PPS, PI, PC, or CAP. In one embodiment, for example, the support substrate 300 may include or be formed of PEN, and may have a thickness greater than that of the substrate 100 and the lower substrate 200 formed of PI.

In such an embodiment, an adhesive layer 303 may be disposed between the support substrate 300 and the lower substrate 200. In an embodiment, after the display device 400 or the like is provided on the lower substrate 200 and the substrate 100, the support substrate 300 is provided on a rear surface of the lower substrate 200 in a subsequent process. In one embodiment, for example, the support substrate 300 may be attached to the rear surface of the lower substrate 200 by using the adhesive layer 303.

According to an embodiment, the display apparatus 3 may be reinforced by locating the support substrate 300 under the substrate 100 and the lower substrate 200 having high flexibility, and the flexibility of the display apparatus 3 may be effectively prevented from being reduced by not providing the support substrate 300 in the bending area BA.

Figure 7:
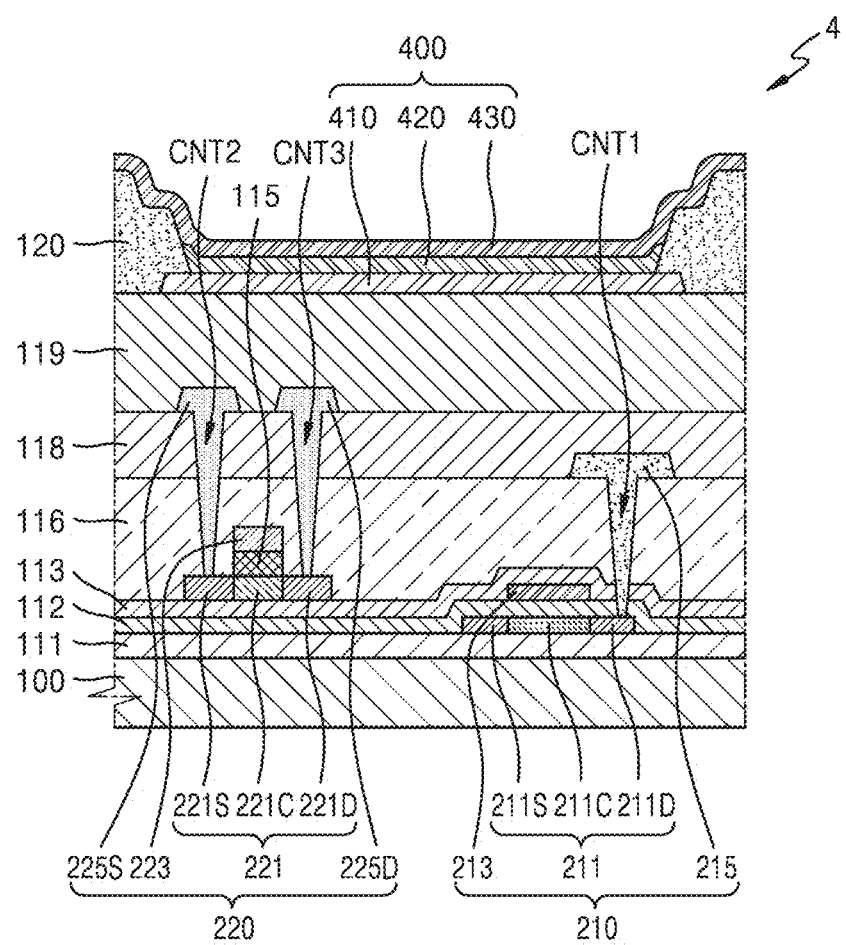
FIG. 7 is a cross-sectional view of a display apparatus according to another alternative embodiment.

FIG. 7 is a cross-sectional view of a display apparatus 4 according to another alternative embodiment.

Elements of the display apparatus 4 of FIG. 7 are substantially the same as those of the display apparatus 1 in the display area DA of FIG. 2 except that the substrate 100 does not include the bending area BA.

In such an embodiment, the substrate 100 may be a flexible substrate or a substrate that is formed of glass or the like and is not flexible. The first TFT 210 and the second TFT 220 may be disposed on the substrate 100. In such an embodiment, the first TFT 210 includes the first active layer 211 including polycrystalline silicon, the first gate electrode 213, and the first electrode 215, and the second TFT 220 includes the second active layer 221 including an oxide semiconductor, the second gate electrode 223, and the second electrode 225 including the source electrode 225S and the drain electrode 225D.

The first electrode 215 and the second electrode 225 including the source electrode 225S and the drain electrode 225D may be disposed at different levels from each other, and the second active layer 221 may be disposed over the first gate electrode 213.

As described above, the first TFT 210 may be a driving TFT, and may include the first active layer 211 including polycrystalline silicon having high reliability to realize the display apparatus 4 having a high resolution. The second TFT 220 may be a TFT having a function different from that of a driving TFT, and may include the second active layer 221 including an oxide semiconductor having low leakage current to reduce power consumption.

Elements included in the display apparatus 4 of FIG. 7 are the same as those of the display apparatus 1 of FIG. 2, and thus any repetitive detailed description thereof will be omitted.

In an embodiment of the display apparatus 1, 2, 3 or 4 according to the invention, since the driving circuit for driving the display device 400 includes the first TFT 210 including the first active layer 211 including or formed of polycrystalline silicon and the second TFT 220 including the second active layer 221 including or formed of an oxide semiconductor, such an embodiment of the display apparatus 1, 2, 3 or 4 may have a high resolution and low power consumption.

According to an embodiment of a method of manufacturing of the display apparatus 1, 2, 3 or 4, since a process of providing the first drain region 211D of the first active layer 211 to contact the first electrode 215 is first performed and then a patterning process of exposing a part of the second active layer 221 is performed, an increase in contact resistance between the first drain region 211D and the first electrode 215 due to oxidation of a surface of the first drain region 211D that may occur during the patterning may be effectively prevented.

According to an embodiment the method of manufacturing of the display apparatus 1, 2 or 3, since the first conductive layer 310 and the second conductive layer 320 provided in the bending area BA and provided at different levels from each other, and the first electrode 215 of the first TFT 210 and the second electrode 225 of the second TFT 220 are formed by using a same mask process, the number of masks used in a manufacturing process may be reduced.

As described above, according to an embodiment, since a driving circuit for driving a display device includes a first TFT including a first active layer including or formed of polycrystalline silicon and a second TFT including a second active layer including or formed of an oxide semiconductor, a display apparatus having a high resolution and low power consumption and a method of manufacturing the display apparatus may be provided.

In an embodiment, since a process of providing a first drain region of a first active layer to contact a first electrode is first performed and then a patterning process of exposing a part of a second active layer is performed, a display apparatus that may effective prevent contact resistance between the first drain region and the first electrode from being increased and a method of manufacturing the display apparatus may be provided.

In an embodiment, since a first conductive layer and a second conductive layer located in a bending area BA and at different levels from each other, and a first electrode of a first TFT and a second electrode of a second TFT are formed by using a same mask process, a display apparatus that may reduce the number of masks used in a manufacturing process and a method of manufacturing the display apparatus may be provided.

While the present invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display apparatus comprising:
a substrate on which a first area, a second area spaced apart from the first area, and a bending area between the first area and the second area and bent along a bending axis are defined;
a first thin-film transistor disposed in the first area;
a second thin-film transistor disposed in the first area; and
a first conductive layer extending from the first area through the bending area to the second area;
a second conductive layer extending from the first area through the bending area to the second area, wherein the first conductive layer and the second conductive layer are disposed at different levels from each other,
wherein the first thin-film transistor comprises:
a first active layer comprising polycrystalline silicon;
a first gate electrode insulated from the first active layer; and
a first electrode connected to the first active layer and disposed at the same level as the first conductive layer, and
the second thin-film transistor comprises:
a second active layer comprising an oxide semiconductor;
a second gate electrode insulated from the second active layer; and
a second electrode connected to the second active layer and disposed at a level, which is the same as the level of the second conductive layer.

2. The display apparatus of claim 1, further comprising:
a display device driven by the first thin-film transistor and the second thin-film transistor,
wherein the first thin-film transistor is a driving thin-film transistor which transmits a driving current to the display device.

3. The display apparatus of claim 1, further comprising:
a first interlayer insulating layer disposed on the substrate to cover the first gate electrode,
wherein the second active layer is disposed on the first interlayer insulating layer.

4. The display apparatus of claim 3, further comprising:
a second interlayer insulating layer disposed on the first interlayer insulating layer to cover the second gate electrode,
wherein the first electrode is disposed on the second interlayer insulating layer.

5. The display apparatus of claim 4, further comprising:
a planarization layer disposed on the second interlayer insulating layer to cover the first electrode,
wherein the second electrode is disposed on the planarization layer.

6. The display apparatus of claim 1, further comprising:
a connection electrode electrically connected to the first electrode and disposed at a level, which is the same as a level of the second electrode.

7. The display apparatus of claim 1, wherein
the first conductive layer and the second conductive layer are electrically connected to each other, and
each of the first conductive layer and the second conductive layer transmits a driving signal to at least one of the first thin-film transistor and the second thin-film transistor.

8. The display apparatus of claim 7, wherein
a plurality of through-holes is defined in each of the first conductive layer and the second conductive layer.

9. The display apparatus of claim 1, wherein
each of the first conductive layer, the second conductive layer, the first electrode and the second electrode comprises aluminum (Al).

10. The display apparatus of claim 1, further comprising:
a bending organic layer disposed between the substrate and the first conductive layer,
wherein at least a portion of the bending organic layer is disposed in the bending area.

11. The display apparatus of claim 1, further comprising:
a capacitor electrode disposed on the first gate electrode to face the first gate electrode,
wherein the second active layer is disposed on a layer that is disposed over the capacitor electrode.

* * * * *